(12) United States Patent
Mokuo

(10) Patent No.: US 6,715,348 B2
(45) Date of Patent: Apr. 6, 2004

(54) METHOD AND APPARATUS FOR DETECTING LIQUID LEVEL

(75) Inventor: Shori Mokuo, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/844,838

(22) Filed: Apr. 27, 2001

(65) Prior Publication Data

US 2002/0124646 A1 Sep. 12, 2002

(30) Foreign Application Priority Data

Apr. 27, 2000  (JP) .................................. 2000-127972

(51) Int. Cl.$^7$ .............................................. G01F 23/00
(52) U.S. Cl. ...................................................... 73/299
(58) Field of Search ............................. 73/290 R, 299, 73/301; 340/614, 620, 626

(56) References Cited

U.S. PATENT DOCUMENTS

| | | | |
|---|---|---|---|
| 4,739,658 A | * | 4/1988 | Slavik ........................ 73/313 |
| 4,845,986 A | * | 7/1989 | Hayashi et al. ........... 73/290 R |
| 4,890,491 A | * | 1/1990 | Vetter et al. .............. 73/290 R |
| 4,891,980 A | * | 1/1990 | Kawai et al. .............. 73/290 R |
| 5,325,716 A | * | 7/1994 | Hafner et al. ................. 73/301 |

FOREIGN PATENT DOCUMENTS

| | | |
|---|---|---|
| JP | 06-109517 | 4/1994 |
| JP | 07-286886 | 10/1995 |

* cited by examiner

*Primary Examiner*—Hezron Williams
*Assistant Examiner*—Katina Wilson
(74) *Attorney, Agent, or Firm*—Morrison & Foerster LLP

(57) ABSTRACT

Apparatus and method for correctly detecting the level of a processing liquid such as HPM in a processing tank in the event that any drift occurs in a detector is disclosed. A liquid level detecting apparatus (70) comprises a pressure sensor (73) operable to generate an output signal S0 which is maintained at a constant signal level until the level of HPM reaches a predetermined position M in the tank and rises in the signal level as the liquid level rises in the tank after reaching the predetermined position M, a determination circuit (93) for determining whether the liquid level reaches the predetermined position M and a liquid level detecting circuit (94) for detecting the liquid level. The output signal S0 from the pressure sensor is input to an amplifier (92). The liquid level detecting circuit (94) comprises a low-pass filter (97) which receives the amplified signal and generates an output pressure signal S4. The liquid level detecting circuit (94) is operable to calculate any difference between the output signal S4 from the low-pass filter and a correction signal ΔS generated by a signal holding circuit (98).

3 Claims, 16 Drawing Sheets

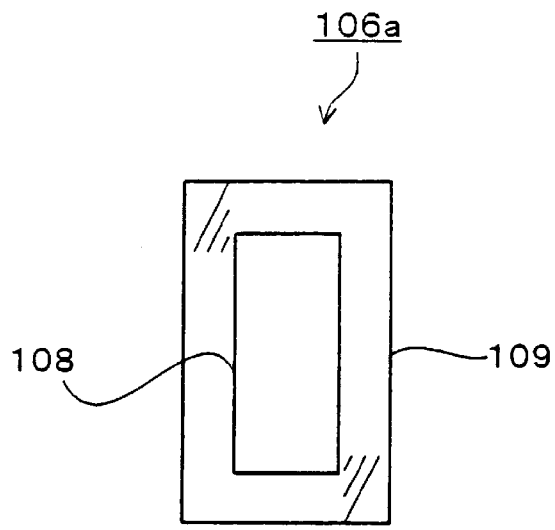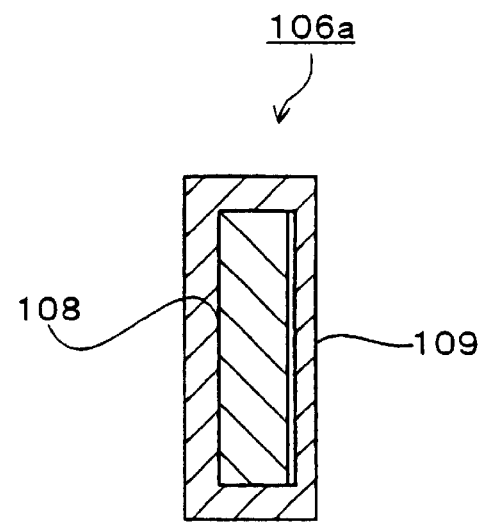
FIG. 7(a)　　　　FIG. 7(b)
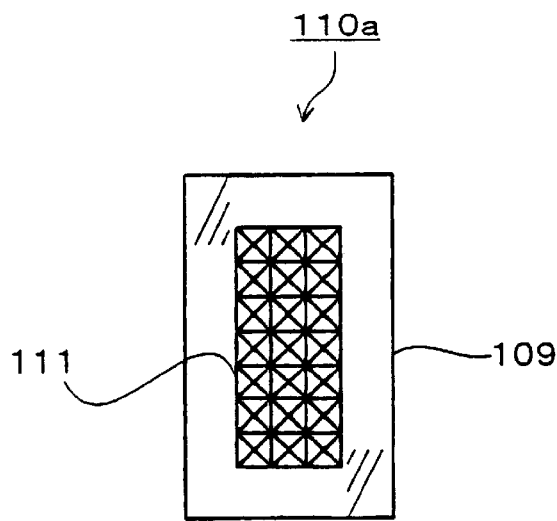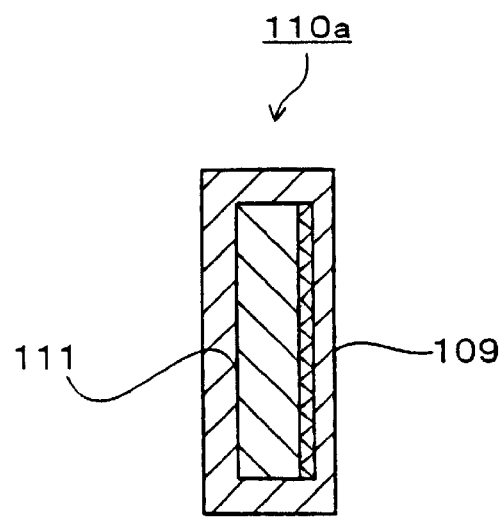
FIG. 8(a)　　　　FIG. 8(b)

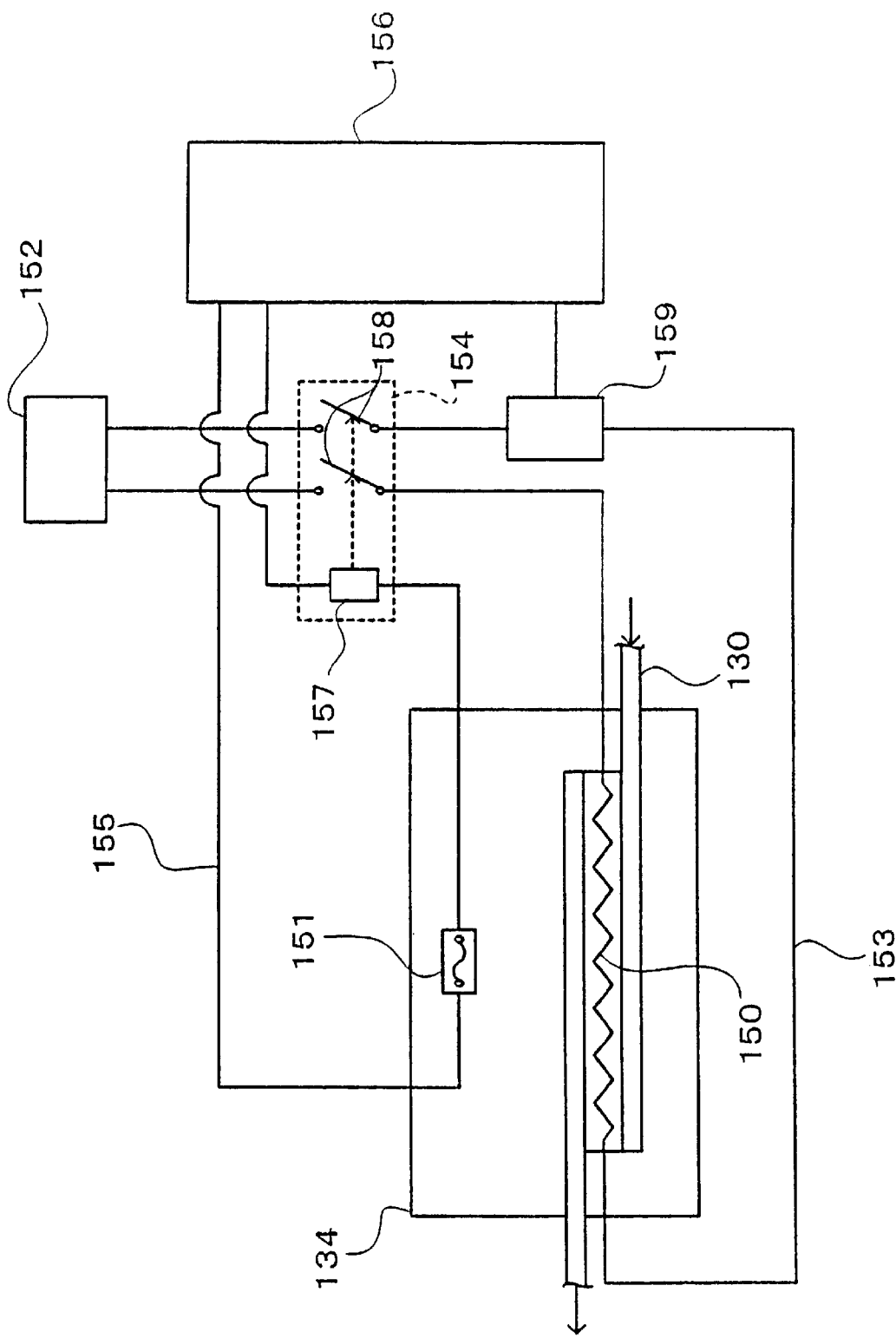
F I G. 12

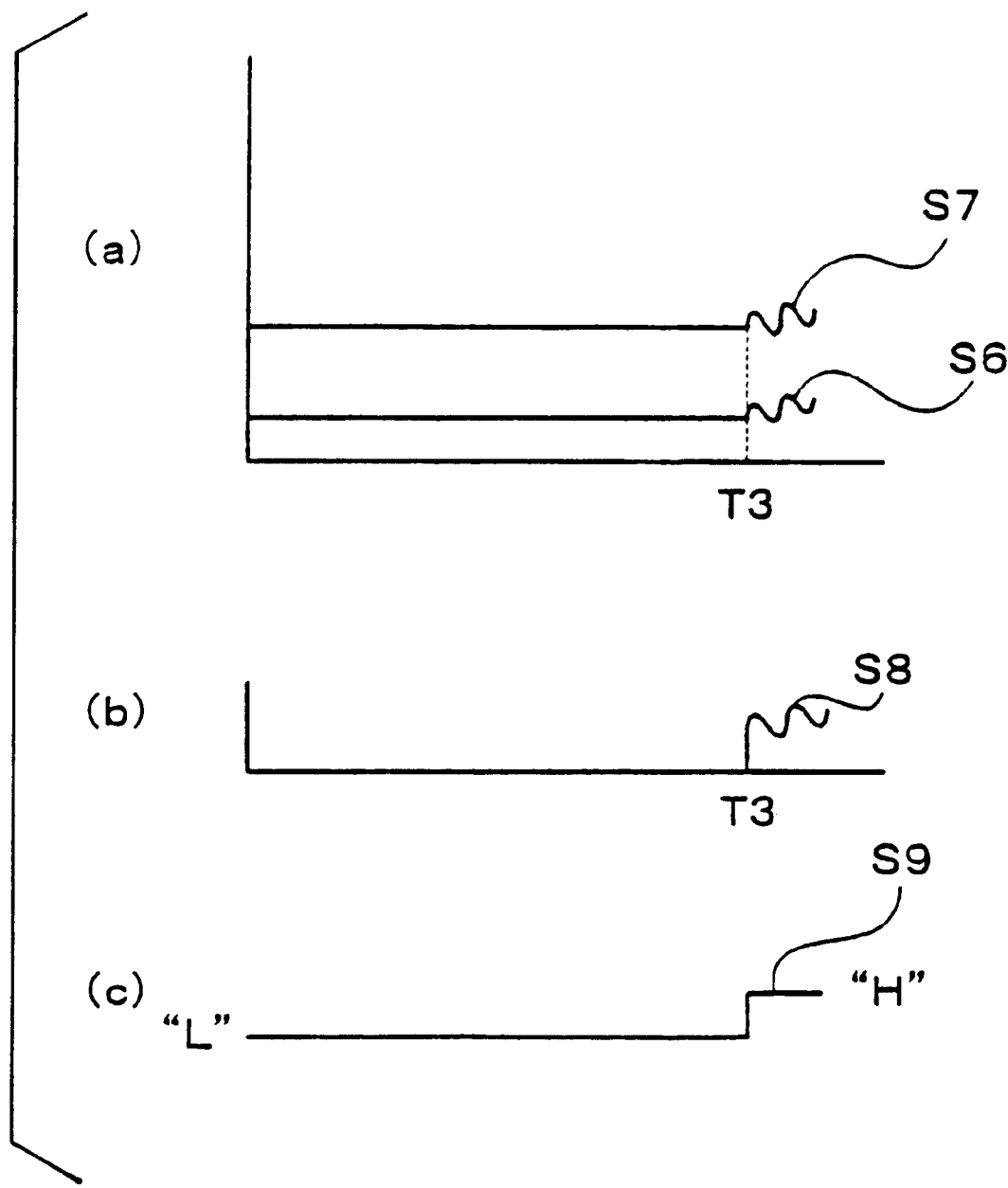
F I G. 16

METHOD AND APPARATUS FOR DETECTING LIQUID LEVEL

CROSS REFERENCE TO RELATED APPLICATIONS

The subject application is related to the subject matter disclosed in Japanese Patent Application No. 2000-127972 filed on Apr. 27, 2000 in Japan to which the subject application claims priority under Paris Convention and which is incorporated herein by reference.

BACKGROUND OF THE INVENTION

1. Field of the Invention

The present invention relates to a method and apparatus for detecting the level of a liquid.

2. Related Background Art

In the fabrication of semiconductor devices, various wafer processing systems are utilized to remove surface contamination such as small particles, organic contaminant materials, metallic impurities or the like from a semiconductor wafer (referred hereinafter to as "wafer") using a processing liquid such as chemicals, pure water and the like. A wet-type processing system, among others, has been widely used wherein the wafers are submerged in a processing tank or bath containing the processing liquid for cleaning.

In such a processing system, it is necessary to fill the processing tank with a selected amount of the processing liquid enough to perform an effective cleaning operation. To this end, a liquid level detector apparatus is used in conjunction with the wafer processing tank for detecting the level of the liquid being supplied in the tank and terminating the supply of the liquid as the liquid level reaches a predetermined position or elevation in the tank.

The liquid level detector apparatus comprises a hollow sensor tube having an open distal bottom end positioned at a predetermined height I the tank and adapted to be immersed in a processing liquid whose level are adapted to be detected, gas supply means for supplying gas having a pressure substantially greater than a pressure prevailing over the liquid upper surface to the sensor tube sufficiently to fill the interior thereof entirely to a depth of the open distal bottom end, a pressure sensor associated with the sensor tube for generating an output signal representative of the gas pressure within the sensor tube and an electrical circuitry for determining the liquid level based on the magnitude of the output signal from the pressure sensor. Thus, the liquid level detecting apparatus is configured for detecting the liquid level based on the gas pressure measured at the predetermined position (i.e., at the predetermined depth) in the processing tank.

More particularly, with the open distal bottom end of the sensor tube immersed in the processing liquid in the tank, the gas supply means supplies the gas such as compressed air or an inert gas having a pressure substantially greater than a pressure (e.g., atmospheric pressure) on the liquid surface into the hollow interior of the sensor tube to a depth level where the open distal bottom end thereof is located, so that the gas pressure within the sensor tube is equal to the liquid pressure being applied to the open distal bottom end of the sensor tube. It is to be understood that the liquid level detector apparatus of the type as outlined above is capable of detecting the liquid level relying on the fact that the gas pressure within the sensor tube is proportional to the distance (depth) measured from the liquid surface to the distal bottom end of the sensor tube. On the other hand, in view of the fact that the distal bottom end of the sensor tube is located at a predetermined height or a known depth in the processing tank, the pressure of the gas being introduced into the hollow sensor tube is equal to the pressure (e.g., atmospheric pressure) on the liquid surface until the level of the processing liquid being supplied comes into contact with the distal bottom end of the sensor tube. During that time period, the pressure sensor will generate an output signal having a constant level or magnitude. Such a pressure-detected output signal generated by the pressure sensor under this condition can be set as a reference signal.

The liquid level will rises as the processing liquid is fed into the processing tank. As can be appreciated by those skilled in the art, the pressure sensor continues to provide the reference pressure signal until the liquid level reaches the level (the predetermined position) where the open distal bottom end of the sensor tube is positioned. When the output signal from the pressure sensor exceeds the reference signal level, this event indicates that the liquid level reaches the predetermined position in the processing tank. The magnitude of the pressure-detected output signal from the pressure sensor rises linearly as the level of the liquid being supplied rises in the tank. The electrical circuitry operates to detect the depth of the distal bottom end and thus the liquid level based on the level of the pressure-detected output signal from the sensor. The pressure-detected output signal of the predetermined level generated by the pressure sensor indicates that the liquid level reaches the predetermined level in the processing tank. This allows an immediate termination of the supply of the processing liquid to the tank.

The pressure sensor may comprise any conventional pressure transducer of the type having a diaphragm displaceable depending on change in the gas pressure and a strain gauge adapted to convert the displacement of the diaphragm into an electrical signal. By way of example, a highly sensitive piezoresistive semiconductor pressure sensor may be used which comprises a diaphragm formed in an N-type silicon substrate and a P-type strain gauge fabricated on a portion of the diaphragm by diffusing a boron layer therein.

The pressure sensor may experience drift under the influence of various environmental conditions (e.g., temperature and humidity) and/or deterioration with age and produce a reference signal drift. For example, in case where the pressure sensor erratically generates a reference signal having a level higher than the normal signal level before the distal bottom end of the sensor becomes immersed in the processing liquid in the cleaning tank, the pressure sensor will generate a signal which is up-shifted relative to a pressure-detected signal level indicative of an actual gas pressure prevailing within the sensor tube at the time when the distal bottom end of the sensor tube becomes immersed in the processing liquid. Under such condition, the pressure sensor will provide prematurely an output signal of the predetermined level to terminate the supply of the processing liquid to the tank before the liquid level reaches the predetermined level in the processing tank, which may lead to reduced cleaning capability due to shortage of the processing fluid. In contrast, when the pressure sensor erroneously generates a reference signal having a level lower than the normal signal at the time the distal bottom end of the sensor tube becomes immersed in the processing liquid, the pressure sensor will produce an output signal having the predetermined level after the liquid level actually reaches the predetermined level or position. As a result, the actual liquid level may ascend past the predetermined level in the tank, which will result in waste of the processing fluid due to excessive supply thereof to the processing tank.

SUMMARY OF THE INVENTION

It is therefore an object of the present invention to provide an apparatus and method for precisely detecting the level of a liquid in spite of any sensor output signal drift.

With the object in view, a first embodiment of the present invention relates to an apparatus for detecting the level of a processing liquid in a processing tank, comprising detector means (e.g., detecting sensor) for generating an output signal related to the level of the liquid being supplied to the tank; a determination circuit for determining when the liquid level reaches a first position established in the tank on the basis of the output signal from the detector means; a liquid level detecting circuit for correcting a relationship between a level of the output signal from the detector means and the liquid level based on a signal generated by said detector means from the time the processing liquid is initially supplied to the tank until immediately after the liquid level reaches the first position to thereby detect the actual liquid level in the tank.

In accordance with the first embodiment of the liquid level detecting apparatus according to the invention, the processing liquid is supplied to the processing tank and the level of the liquid rises in the tank accordingly. The detector means generates an output signal related to the level of the liquid being supplied to the tank. More particularly, the detector means generates an output signal having a constant level or magnitude until the liquid level reaches a first position or level established in the tank. The detector means, which properly operates, generates an output signal from the time the processing liquid is initially supplied until immediately after the liquid level reaches the first position, is set as a reference signal. As the liquid level reaches the first position level, the magnitude of the output signal from the detector means will exceed the reference signal level. From this event, the determining circuit can determine whether the liquid level reaches the first position. At that time, the amount of the processing liquid within the tank can be determined because the depth of the predetermined position is known. As the liquid level continues to rise past the first position, the level of the output signal from the pressure sensor rises accordingly. It is noted that the signal level indicates the magnitude of the pressure-detected signal.

When the pressure sensor may experience drift resulting from the environmental conditions (e.g., temperature and humidity) and/or deterioration with age, the detector means will generate a pressure signal whose level is either up-shifted or down-shifted with respect to a signal level representative of the actual liquid level in the tank. However, in the present invention, the liquid level detecting circuit functions to correct the output signal from the detector means on the basis of a reference signal provided by the detector mans from the time the processing liquid is initially supplied to the tank until immediately after the liquid level reaches the first position to provide a signal correctly representing the actual liquid level, which signal is substantially similar to the signal obtained when no drift occurs in the detector means during detection of the liquid level within the tank. More specifically, the output signal form the detector means can be corrected by compensating for the difference in signal level between the reference signal (known value) and the pressure-detected output signal from the detector means till immediately after the liquid level reaches the first position from the bottom level of the tank. Thus, the liquid level of the processing liquid in the tank can be correctly determined even if the detector means can experience the drift.

In accordance with a second embodiment of the invention, preferably, the liquid level detecting apparatus further comprises a hollow sensor tube having an open distal bottom end positioned at the first position and adapted to be immersed in the processing liquid and gas supply means for supplying gas having a pressure substantially greater than a pressure prevailing over the liquid upper surface to the sensor tube sufficiently to fill the interior thereof entirely to a depth of the open distal bottom end, the detector means providing the output signal representative of the gas pressure within the sensor tube, the determination circuit comprising a high-pass filter for extracting ripple in the output signal to generate an AC signal and a signal processor for rectifying the AC signal from the high-pass filter.

With this arrangement, the gas supply means supplies the gas such as compressed air or an inert gas having a pressure substantially greater than a pressure (e.g., atmospheric pressure) prevailing over the liquid surface into the hollow interior of the sensor tube to a depth level where the open distal bottom end thereof is located, so that the gas pressure within the sensor tube is equal to the pressure prevailing over the liquid surface until the liquid level reaches the first position. As discussed above, the detector means outputs a signal having a constant (flat) level to the high-pass filter of the determination circuit. The high-pass filter will generate a zero level signal because of the constant level signal from the detector means, which signal is coupled to the signal processor. Then, the signal processor will provide a "Low level" signal.

The gas supply means continues to supply the gas to the sensor tube in such a manner as to fill the hollow interior of the sensor tube entirely, in other words to prevent the processing liquid from entering the open distal bottom end of the sensor tube. As a result, bubbles emerge from the open distal tube end intermittently or periodically. Such bubbling can cause fluctuation in the gas pressure in the sensor tube and as a result the detector means may generate an output signal containing an alternating component or ripple, which signal is input to the high-pass filter of the determination circuit. The high-pass filter extracts only the alternating component in the output signal to output an AC signal to the signal processor. The signal processor rectifies the AC signal to generate a "Hi level" signal, which indicates that the liquid level reaches the first position. Thus, the extraction of the alternating component in the signal allows the determining circuit to reliably determine whether the liquid level reaches the first position, which can provide a correct liquid level detection in spite of detector output signal drift.

As can be seen, the gas pressure prevailing within the sensor tube is equal to the liquid pressure being applied to the open distal bottom end of the sensor tube and also is proportional to the distance (depth) measured from the liquid surface to the distal bottom end of the sensor tube. The detector means can detect the gas pressure within the sensor tube to provide an output signal on the basis of which the depth of the distal bottom end of the tube and thus liquid level in the tank can be determined. Alternatively, or in a third embodiment, the detector means is operable to detect when the liquid level reaches a second position higher than the first position in the processing tank. With this arrangement, it is possible to supply a predetermined amount of the processing liquid to the tank, thereby avoiding reduction in processing capability and also waste of the processing liquid. No limit sensor on the top of the processing tank for establishing the upper limit of the liquid level in the tank, is required.

A fourth embodiment of the present invention provides an apparatus for detecting the level of a processing liquid in a processing tank, comprising detector means for generating an output signal related to the level of the liquid being supplied to the tank; a liquid level detecting circuit for comparing a signal level of a output signal generated by the detector means before the liquid level reaches the predetermined position to a predetermined reference signal level to generate a correction signal and for correcting the output signal generated by the detector means on the basis of the correction signal to detect the liquid level in the tank.

In accordance with the fourth embodiment, the processing liquid is supplied to the processing tank and the level of the liquid rises in the tank accordingly. The detector means generates an output signal related to the liquid level and outputs the signal to the liquid level detecting circuit. After the liquid level reaches the predetermined position, the detector means will generate an output signal corresponding to the liquid level rising past the predetermined position. In the liquid level detecting circuit, the signal level of the reference signal is set to be equal to that of the signal output from the properly operating detector means at the time when the liquid level reaches the predetermined position.

When the pressure sensor may experience drift resulting from the environmental conditions (e.g., temperature and humidity) and/or deterioration with age, the detector means will generate a pressure signal whose level is either up-shifted or down-shifted with respect to a signal level representative of the actual liquid level in the tank. According to the teachings of the present invention, the liquid level detecting circuit is operable to calculate the difference the level of the output signal generated by the detector means prior to the detection of when the liquid level reaches the predetermined position and the level of the reference signal to provide a correction signal representative of the difference. Thereafter, the correction signal is subtracted from (or added to) the output signal from the detector means, thereby compensating for the difference. The corrected signal level always corresponds to the actual liquid level in the processing tank. Thus, the liquid level detecting system is arranged in such a manner as to precisely determine the liquid level of the processing liquid in the tank even if the detector means could experience the drift.

A fifth embodiment of the present invention provides an apparatus for detecting the level of a processing liquid in a processing tank, comprising detector means for generating an output signal related to the level of the liquid being supplied to the tank; a determining when the liquid level reaches a predetermined position established in the processing tank to generate an output signal; a determination circuit for determining when the liquid level reaches a predetermined position on the basis of the output signal from said detector means; a liquid level detecting circuit for comparing a signal level of a output signal generated by the detector means before the liquid level reaches the predetermined position to a predetermined reference signal level to generate a correction signal and for correcting the output signal generated by the detector means based on the correction signal to detect the liquid level in the tank.

In accordance with the fifth embodiment, the processing liquid is supplied to the processing tank and the level of the liquid rises in the tank accordingly. The detector means generates an output signal related to the liquid level and provides the output signal to the liquid level detecting circuit. After the liquid level reaches the predetermined position, the detector means will generate an output signal corresponding to the liquid level rising past the predetermined position. In the liquid level detecting circuit, the signal level of the reference signal is set to be equal to that of the signal output from the properly operating detector means at the time when the liquid level reaches the predetermined position. The liquid level detecting circuit is operable to calculate the difference the level of the output signal generated by the detector means prior to the detection of when the liquid level reaches the predetermined position and the level of the reference signal to provide a correction signal representative of the difference. Thereafter, the correction signal is subtracted from (or added to) the output signal from the detector means, thereby compensating for the difference. The corrected signal level always corresponds to the actual liquid level in the processing tank. Thus, as in the fourth embodiment of the invention as described above, the liquid level detecting system is arranged in such a manner as to precisely determine the liquid level of the processing liquid in the tank even if the detector means could experience the drift.

A sixth embodiment of the present invention provides an apparatus for detecting the level of a processing liquid comprising a hollow sensor tube having an open distal bottom end positioned at a predetermined position established in the tank and adapted to be immersed in a processing liquid whose level are adapted to be detected; gas supply means for supplying gas having a pressure substantially greater than a pressure prevailing over the liquid upper surface to the sensor tube sufficiently to fill the interior thereof entirely to a depth of the open distal bottom end; detector means associated with said sensor tube for generating an output signal representative of the gas pressure within the sensor tube; a determination circuit coupled to an output terminal of the detector means for determining whether the surface of the liquid being supplied comes into contact with the open distal bottom end of the sensor tube; and a liquid level detecting circuit coupled to the output terminal of the detector means for detecting the liquid level; the determination circuit comprising a high-pass filter for extracting only an alternating component in the output signal to generate an AC signal and a signal processor for rectifying the AC signal from the high-pass filter; and the liquid level detecting circuit a low-pass filter for removing the alternating component in the output signal to generate an output signal, buffer means for storing and outputting the output signal from the low-pass filter from the time the processing liquid is initially supplied until immediately after the liquid surface comes into contact with the open distal bottom end of the sensor tube and calculating means having two input terminals, one of the input terminal being coupled to an output of the low-pass filter and the other input being coupled to an output terminal of the buffer means for calculating any difference between the output signal from the low-pass filter and the output signal from the buffer means.

A seventh embodiment of the present invention provides an apparatus for detecting the level of a processing liquid in a processing tank, comprising a first detector means disposed in the processing tank for detecting change in pressure in a first hollow sensor tube to which gas is supplied to generate a first output signal representative of the change, the sensor tube having an open distal bottom end; a first determination circuit for determining when the liquid level reaches a first predetermined position established in the tank on the basis of said output signal from said first detector means; a liquid level detecting circuit for correcting a relationship between a level of said output signal from said first detector means and the liquid level on the basis of a signal generated by said first detector means at the time the liquid level reaches the first predetermined position to thereby detect the liquid level in the tank; a second detector mans disposed in the processing tank for detecting change in pressure in a second hollow sensor tube to which gas is supplied to generate a second output signal representative of said change, said second sensor tube having an open distal bottom end; a second determination circuit for determining when the liquid level reaches a second predetermined position defined in the tank on the basis of said output signal from said second detector means.

An eighth embodiment of the present invention relates to a method for detecting the level of a processing liquid in a processing tank, comprising the steps of: supplying the processing liquid to the processing tank; determining whether the liquid level reaches a predetermined position established within the processing tank to generate an output signal by means of detector means disposed in the processing tank and generating an output signal in response to said determination; detecting when liquid level reaches said predetermined position; and correcting a relationship between a level of said output signal from said detector means and the liquid level on the basis of an output signal generated by said detector means at the time the liquid level reaches the predetermined position to thereby detect the liquid level in the tank.

A ninth embodiment of the present invention provides a method for detecting the level of a processing liquid in a processing tank, comprising the steps of: supplying the processing liquid to the processing tank; determining whether the liquid level reaches a predetermined position established within the processing tank to generate an output signal by means of detector means disposed in the processing tank and generating an output signal in response to said determination; detecting when liquid level reaches said predetermined position; and correcting a relationship between a level of said output signal from said detector means and the liquid level on the basis of a signal generated by said detector means at the time the processing liquid is initially supplied to thereby detect the liquid level in the tank.

The liquid level detecting methods as constructed above correct the relationship between a level of the output signal from the detector means and the liquid level based on the signal level obtained at the time when the liquid level reaches the predetermined position in the case of the first-mentioned method and the signal level obtained at the time when the processing liquid is supplied to the processing tank in the case of the second-mentioned method. In either case, the liquid level can be correctly detected in spite of the drift. The eighth and ninth embodiments can be successfully carried out by the first and fourth to seventh embodiments.

A tenth embodiment of the invention relates to a method for detecting the level of a processing liquid in a processing tank, comprising the steps of supplying the processing liquid to the processing tank; detecting the liquid level by means of detector means disposed in the processing tank for detecting change in pressure in a hollow sensor tube to which gas is supplied; and generating an output signal representative of said change in pressure in said sensor tube.

According to this method, the gas is supplied under pressure to the processing tank. The gas pressure within the sensor tube is constant and equal to the pressure prevailing over the liquid surface until the liquid level comes into contact with the distal bottom end of the sensor tube. When the liquid level reaches the open distal bottom end of the sensor tube, bubbles begin to emerge intermittently or periodically from the open tube end, which can cause variations in the gas pressure within the sensor tube. The gas pressure within the sensor tube is equal to the liquid pressure acting across the open tube end and is proportional to the distance (depth) measured from the liquid surface to the distal bottom end of the sensor tube. Thus, it is possible to detect the liquid level in the tank by providing an output signal in response to the pressure variations. The tenth embodiment can be preferably carried out by the second and third embodiments of the liquid level detecting apparatus according to the present invention.

BRIEF DESCRIPTION OF THE DRAWINGS

FIGS. 7(a) and (b) are side elevational and longitudinal cross-sectional views of a reflector.

FIGS. 8(a) and (b) are side elevational and longitudinal cross-sectional views of a modified reflector.

FIG. 12 is a schematic diagram of a heater unit for use with the wafer processing system according to the present invention.

FIGS. 16(a) to (c) are waveform charts illustrating the operation of a pressure sensor for detecting an upper limit for the processing liquid in the processing tank, a determining circuit and the like of the liquid level detecting apparatus shown in FIG. 15.

DESCRIPTION OF THE PREFERRED EMBODIMENTS

Preferred embodiments of the present invention will now be described with reference to the accompanying drawings.

Figure 1:
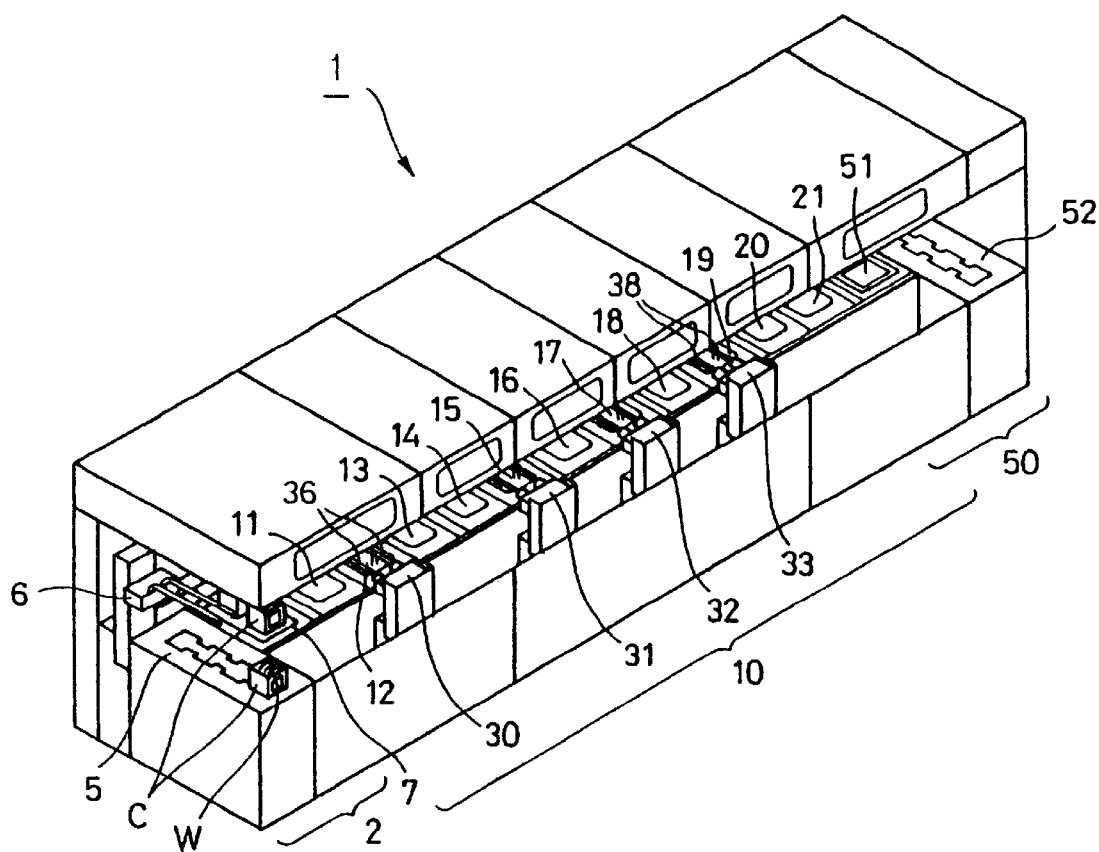
FIG. 1 is a schematic perspective view of a wafer processing system incorporating a first embodiment of a liquid level detecting apparatus according to the present invention.

FIG. 1 is a perspective view of a wafer processing system 1 incorporating a liquid level detecting apparatus 70 according to a first embodiment of the present invention. The wafer processing system 1 is conventionally arranged to successively perform various operations on a batch basis that include loading of substrates such as the wafers W contained in a carrier or cassette C, wet cleaning or washing of the wafers W, drying of the wafers W and then unloading of the wafers contained in the cassette C.

As shown, the processing system 1 comprises a wafer loading station 2, a cleaning and drying station 10 and a wafer unloading station 50. At the loading station 2, cassettes each containing a predetermined number of, for example 25, wafers W to be processed are provided and the wafers W are taken out of the cassettes C for cleaning thereof. More specifically, at the loading station 2, the cassettes C are loaded in succession on a platform 5 and then transferred, for example two at a time to a loader 7 by means of an elevator device 6 for raising and lowering the cassettes. The loader 7 is operable to take the wafers W out of the cassettes C.

The cleaning and drying station 10 has a plurality of movable transfer device 31, 32 and 33 disposed at the front thereof (as viewed in FIG. 1) and comprises a washing and drying section 11 or units for a wafer chuck 36 of the transfer device 30, a series of processing sections or units 12 to 19 for cleaning the wafers W on a batch basis using processing liquid including chemicals, pure water and the like, a washing and drying section or units 20 for a wafer chuck 38 of the transfer device 33 and a dryer section or unit 21 for drying the cleaned wafers W by means of, for example, vapor of isopropyl alcohol (hereinafter referred to as IPA), all the elements being arranged in the order mentioned above from the loading station 2. According to the standard cleaning practice, the cleaning and drying station 10 can be arranged to alternately perform operations of cleaning the wafer with the chemicals and of rinsing thereof. More specifically, at the cleaning and drying station 10, the processing sections 12, 14, 16 and 18 can provide for the chemical cleaning whereas the processing sections 13, 15, 17 and 19 can perform the rinsing operation.

At the unloading station 50, any suitable number, for example 25 of the cleaned and dried wafers W are placed in each of the corresponding cassettes C using an unloader 51 disposed adjacent the drying unit 21. Subsequently, the cassettes C with the wafers W contained therein are successively can be transferred onto an unloading platform 52 by means of an elevator device (not shown).

Figure 2:
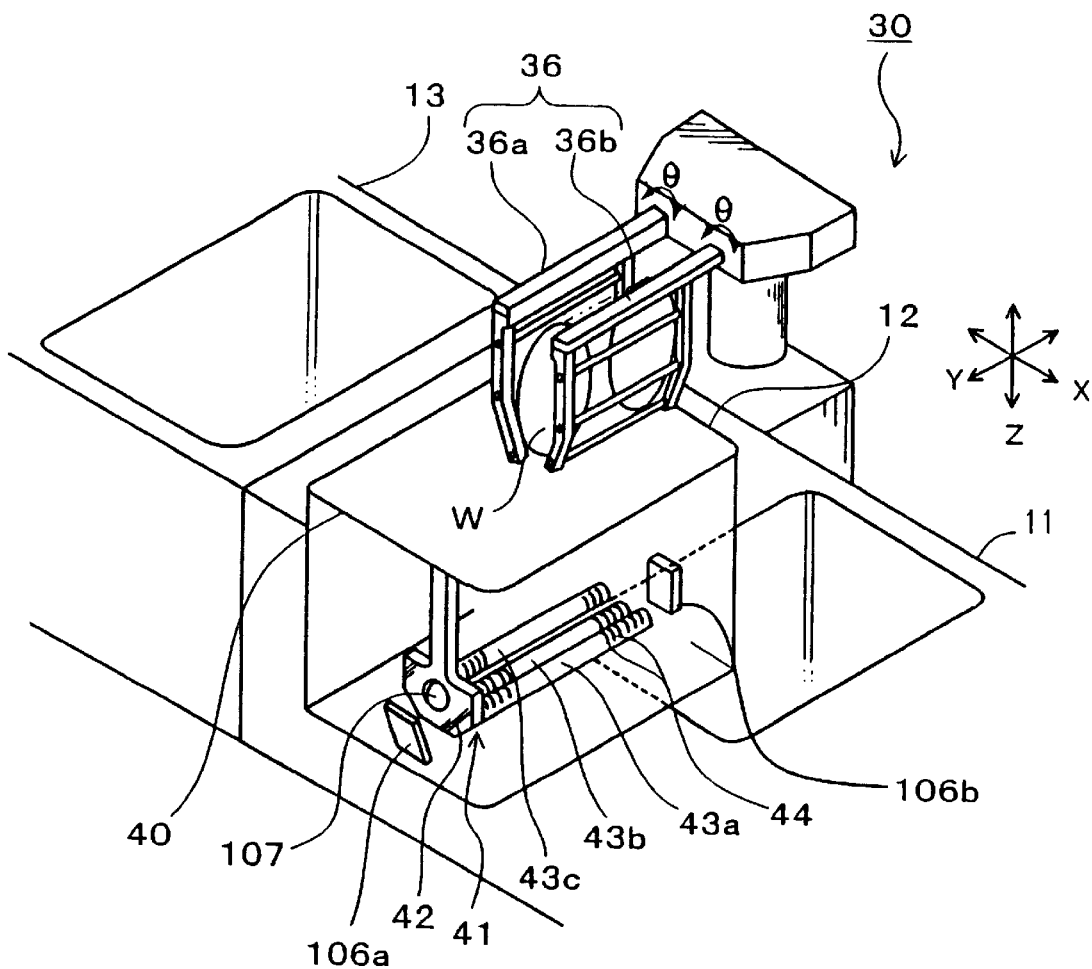
FIG. 2 is an enlarged perspective view of a portion of the wafer processing system shown in FIG. 1 and showing a wafer transfer device.

The movable transfer devices 30, 31 and 32 are substantially similar to each other and the following description will focus by way of example on the transfer device 30 used to transfer the wafers W between the wafer chuck cleaning and drying section 11 and the wafer processing sections 12 and 13. As shown in FIG. 2, the wafer chuck 36 of the transfer device 30 is composed of a pair of opposing gripper members 36a and 36b adapted to hold the number of the wafers in the two cassettes C, for example, 50 wafers W in the particular embodiment as shown, at a time. The gripper members 36a and 36b are mounted in such a manner as to be rotated in a direction indicated by θ shown in FIG. 2 as well as translated in a horizontal direction indicated by Y and in a vertical direction indicated by Z. The transfer device 30 itself is mounted for sliding movement in a direction (indicated by X) lengthwise of the wafer processing system 1 along a guide (not shown).

Also, as shown in FIG. 2, the wafer processing unit 12 has a dual tank assembly 40 defining a processing bath or chamber in which is disposed on the bottom a wafer guide 41 for holding the wafers W thereon. The guide 41 has a vertical guiding member 42 and three parallel holding members 43a, 43b and 43c secured to the guiding member 42 in a horizontal orientation. Each of the holding members 43a–c has equally spaced parallel grooves or cutouts 44 in the top thereof at a total of 50 positions therealong in the embodiment as shown. Thus, the holding members 43a–c can hold the 50 wafers in equally spaced relationship with the wafers at their respective lower peripheral edges being received in the corresponding grooves 44 of the holding members.

Figure 3:
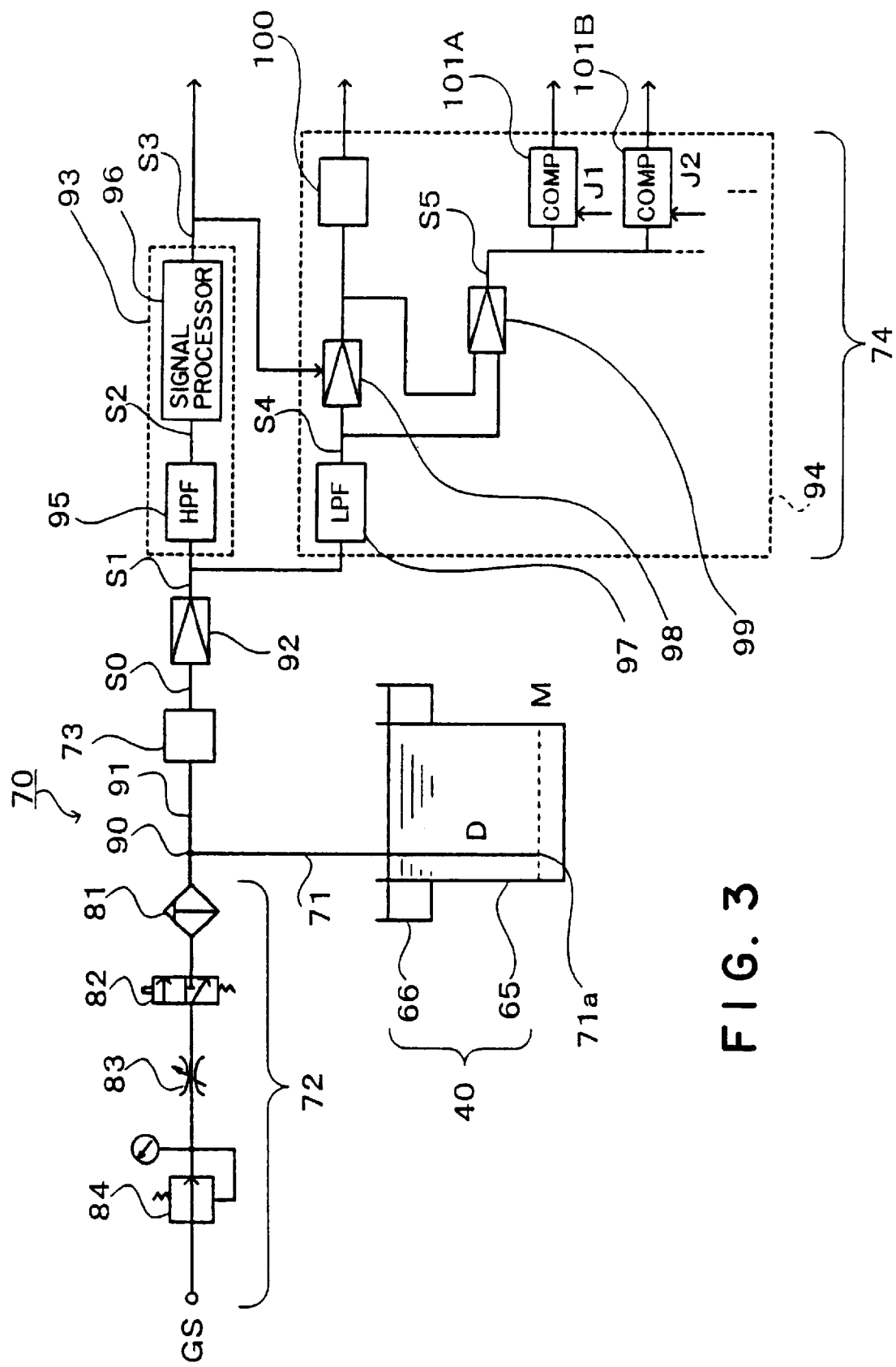
FIG. 3 is a schematic diagram of the first embodiment of the liquid level detector apparatus according to the present invention.

Referring to FIG. 3, the first embodiment of the liquid level detecting apparatus 70 is shown as associated with the wafer processing unit 12 of the system 1. As shown, the processing dual tank assembly 40 is composed of inner and outer tanks 65 and 66. The inner tank 65 is in the form of a rectangular vessel and sized sufficiently to receive the plurality of the wafers W therein. The inner tank is adapted to be supplied with chemicals such as HPM (a liquid mixture of $HCl/H_2O_2/H_2O$) so that SC2 cleaning can be carried out, thereby removing metallic ions adhering to the wafer surface. Typically the top surface of the HPM is exposed to atmosphere. The outer tank 66 surrounds and is attached to the upper portion of the inner tank 65 so as to define an annular chamber therebetween which can receive the HPM overflowing the top edge of the inner tank 65.

The liquid level detecting apparatus 70 comprises sensor or detector means in the form of a hollow sensor tube 71 and a pressure sensor 73, gas supply means 72 and an electric circuitry 74. The hollow sensor tube 71 is vertically oriented and immersed in the HPM in the inner tank 65, and has an open distal bottom end 71a positioned at a predetermined level or position M in the inner tank 65 that is lower than the normal level of the top surface the HPM in the normal operation. In detecting the level of the HPM in the tank, it is understood that the open distal bottom end of the sensor tube 71 becomes immersed in the HPM in the inner tank.

As can be seen in FIG. 3, gas supply means 72 comprises a filter 81 provided in the sensor tube 71, a three way valve 82, a needle valve 83 and regulator 84. The sensor tube 71 is fluid communication with a source of gas GS such as an compressor (not shown) through the component mentioned above. The source of gas can provide gas having a predetermined pressure including an inert gas such as $N_2$, compressed air or the like. When the three way valve 82 is operated to port the gas GS to the sensor tube 71, the gas is supplied through the regulator 84, the needle valve 83 and the filter 81 toward the open distal bottom end 71a of the sensor tube 71. The pressure of the gas flowing through the sensor tube 71 is controlled by the regulator 84 and the needle valve 83. The gas supply means 72 is arranged so as to supply the gas having a pressure higher than that of the pressure prevailing over the liquid surface through the sensor tube 71 to the distal bottom end 71a thereof.

Figure 4:
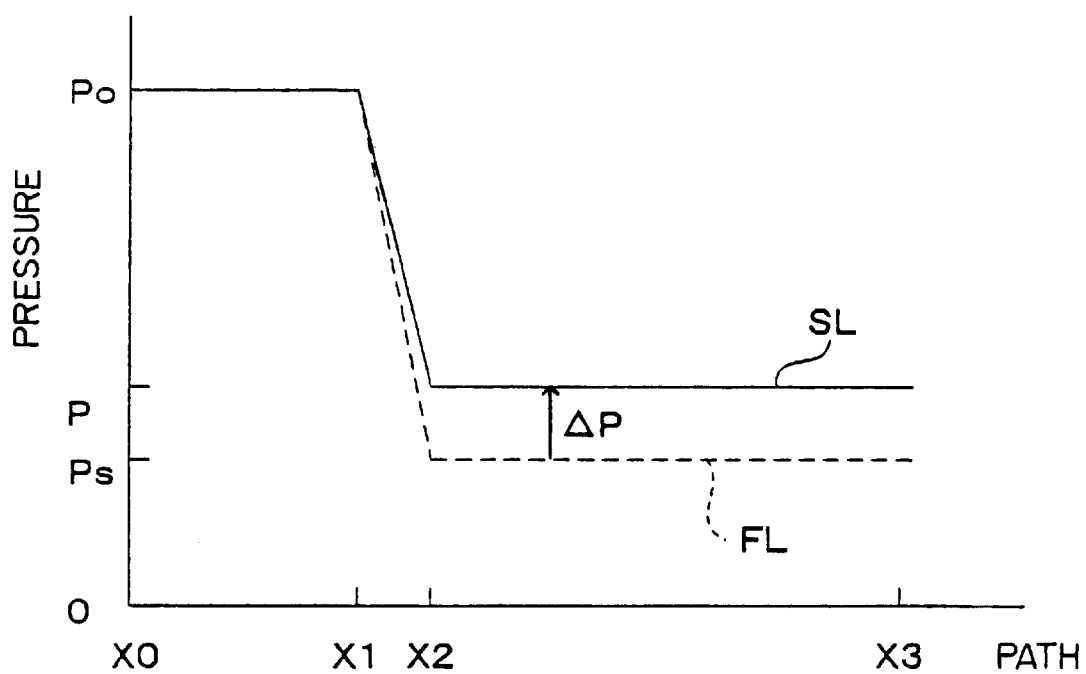
FIG. 4 is a graph of pressures at different positions in the liquid level detector apparatus.

FIG. 4 shows a pressure versus position graph for the sensor tube 71 in operation. In FIG. 4, X0, X1, X2 and X3 indicate positions of an output of the source of gas, an input of the regulator 84, an output of the needle valve, and the open distal bottom end of the sensor tube 71, respectively. The source of gas is arranged to provide an initial pressure Po of, for example 3 atm. ($3 \times 1.01325 \times 10^5$ Pa), which may be much higher than the pressure prevailing over the liquid surface (the atmospheric pressure in the case of the embodiment as shown). The regulator 84 and the needle valve 83 operate together to reduce the initial pressure so that it is equal to a pressure adjacent the distal bottom end 71a of the sensor tube 71. A constant pressure P may be maintained within the sensor tube 71 from the outlet of the needle valve 83 at X2 to the distal bottom end 71a at X3. The broken line FL indicates a pressure level at each of the positions X1, X2 and X3 when the level of the liquid within the inner tank 65 is lower than that of the distal bottom end 71a of the sensor tube 71. Under such a condition, the pressure within the sensor tube 71 from the output (X2) of the needle valve 83 to the distal bottom end 71a of the tube 71 should be equal to a pressure Ps which in turn is equal to the atmospheric pressure ($1.0325 \times 10^5$ Pa). As the liquid level is higher than the distal bottom end level, i.e., the distal bottom end 71a of the sensor tube 71 is immersed in the HPM in the tank 65, the pressure from the output (X2) of the needle valve 83 to the distal bottom end 71a of the sensor tube 71 is equal to a pressure indicated by P in FIG. 4 which is higher than the pressure Ps by AP which will depends on the length (depth D) measured from the HPM surface to the sensor tube distal bottom end 71a.

The pressure sensor 73 is in fluid communication with the hollow sensor tube 71 via a line 91 to a connector 90 provided in the flow line between the filter 81 and the distal bottom end 71a of the sensor tube 71, so that it can detect the pressure present within the sensor tube 71. The pressure sensor 73 may comprise a highly sensitive piezoresistive semiconductor pressure sensor including any conventional pressure transducer of the type having a diaphragm displaceable depending on change in the gas pressure and a strain gauge adapted to convert the displacement of the diaphragm into an electrical signal (for example, an amount of voltage).

Figure 5:
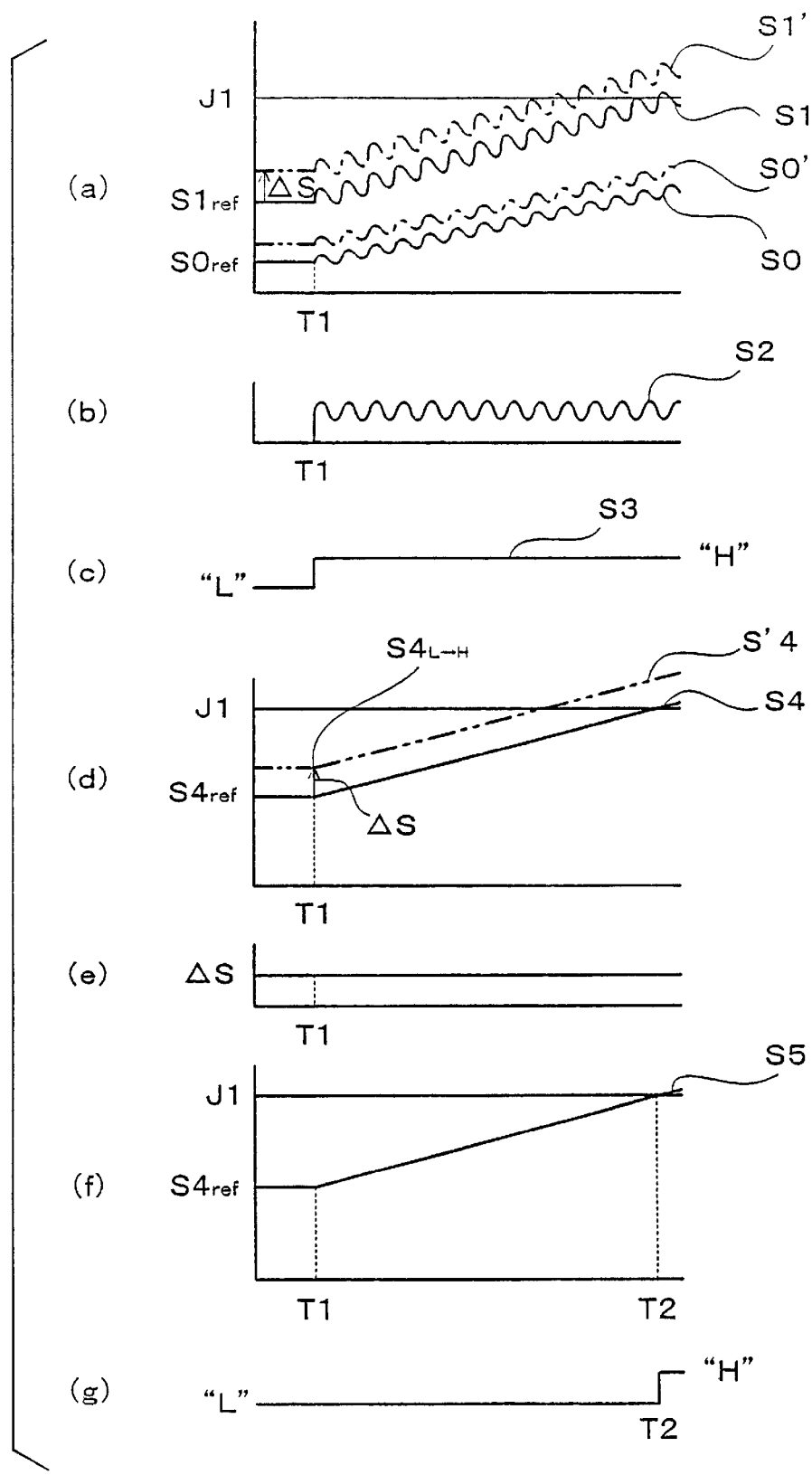
FIGS. 5(a) to (g) are waveform charts illustrating the operation of an electrical circuitry of the liquid level detector apparatus shown in FIG. 3.

The pressure sensor 73 is operable to output a pressure-detected signal representative of an actual pressure within the sensor tube 71. The solid line S0 shown in FIG. 5(a) indicates how the signal S0 indicative of the pressure being detected changes over time. As described above, the pressure within the sensor tube 71 is maintained at the atmospheric level Ps until the time T1 at which the HPM surface reaches the predetermined level M which is equal to the level of the distal bottom end 71a of the sensor tube 71 while the HPM is continuously fed into the inner tank 65, and therefore the pressure sensor 73 continues to generate a pressure-detected output signal S0 having a constant signal level. The signal indicative of the pressure-detected by the detector sensor 73 from the time the HPM is initially supplied to the tank until the time the liquid surface reaches the predetermined position M, is hereinafter referred as "reference signal $S0_{ref}$". It should be noted that the signal level indicates a reading of each of the pressure-detected signals.

Thereafter, as the liquid level of the HPM rises past the level of the distal bottom end 71a of the sensor tube, i.e., the measured length between the liquid level and the sensor tube distal bottom end 71a increases, the pressure within the sensor tube 71 increases, so that the level of the output signal S0 from the pressure sensor 73 may be increased correspondingly, while the gas supply means 72 continues to supply the gas so that the sensor tube 71 can be filled with the gas from the top to the distal bottom end 71a, i.e., the HPM may be prevented from entering the distal bottom end 71a of the sensor tube. As a result, bubbles are ejected intermittently or periodically from the distal bottom end 71a of the sensor tube 71. It can be appreciated by those skilled in the art that such a so-called bubbling can cause fluctuation in the gas pressure within the sensor tube so that the level of the pressure-detected signal S0 increases while exhibiting the fluctuations as shown in FIG. 5(a).

The pressure sensor 73 has its output terminal which is connected to an amplifier 92 which in turn is connected to both a determination circuit 93 and a liquid level detector circuit 94 of the electrical circuitry 74. The amplifier 92 serves to increase the pressure signal So to a level S1 (indicated by the solid line S1 in FIG. 5(a)) sufficient to be processed since the level of the signal S0 is low. Similarly, the pressure-detected signal S1 generated until the time T1 is defined as a reference signal $S1_{ref}$ and contains a periodically alternating component or ripple as shown. Such alternating component may result from the bubbling as described above.

The determination circuit 93 comprises a high-pass filter 95 for extracting only the alternating component from the pressure-detected output signal S1 and providing an AC signal S2 and a signal processor 96 for rectifying the AC signal S2 to produce a signal S3 and determines whether the liquid level reaches the position M, i.e., the level of the distal bottom end 71a of the sensor tube 71.

The flat reference signal $S1_{ref}$ is input to the high-pass filter 95 until the liquid level reaches the predetermined level or position M, which high-pass filter will provide a zero signal due to no alternating component present in the reference signal $S1_{ref}$. The zero signal is input to the signal processor 96. As shown in FIG. 5(c) the signal processor 96 will provide a "Low level" output signal S3 as a result thereof. When the liquid level reaches the predetermined position M and as a result the resulting pressure-detected output signal S1 is generated by the pressure sensor 73, the high-pass filter 95 extracts the alternating component in the signal S1 while filtering out the low-frequency component contained therein and provide an AC signal S2 (FIG. 5(b)). Then, the AC signal S2 is input to the signal processor 96. The signal processor 96 is operable to rectify, and then integrate, the AC signal S2 to provide a certain level signal. Such a signal is define as a "Hi level" output signal which may have a constant threshold value. The output signal S3 is input to a signal holding circuit 98 (including an amplifier and the like) which may be used as memory or buffer means, which will be more in detail hereinafter.

The liquid level detector circuit 94 serves to detect the surface level of the HPM in the inner tank 65. In the detector circuit 94, the pressure-detected signal S1 is input to the low-pass filter 97, which removes the high-frequency or alternating component and provides a pressure-detected signal S4 (indicated by the solid line in FIG. 5(d)). Output terminal of the low-pass filter 97 is connected to both the signal hold circuit 98 and an arithmetic amplifier 99.

The signal holding circuit 98 has a reference signal $S4_{ref}$ previously stored therein. The level of the reference signal $S4_{ref}$ is set to be equal to a level of a pressure-detected signal $S4_{L-H}$ generated by the low-pass filter 97 at the time the output signal from the signal processor 96 is changed from "Low level" to "Hi level", i.e., the liquid level reaches the predetermined position M under a condition where the pressure sensor 73 operates properly. The signal hold circuit 98 is operable to subtract the reference signal $S4_{ref}$ from the pressure-detected output signal $S4_{L-H}$ generated by the low-pass filter 97 at the time the liquid level reaches the predetermined position M in the tank to provide a correction signal ΔS which can be expressed by the following equation:

$$\Delta S = S4_{L-H} S4_{ref} \quad (1)$$

When the pressure sensor 73 operates properly, the detected pressure-detected signal $S4_{L-H}$ should be of course equal to the reference signal $S4_{ref}$ and as a result the level of the correction signal ΔS is equal to zero. With the arrangement of the present invention, when the pressure sensor 73 experiences drift which result in a considerable deviation of the signal level as described below, such a deviation can be compensated for by the correction signal ΔS which is the difference between the pressure-detected signal $S4_{L-H}$ and the reference signal $S4_{ref}$.

As shown in FIG. 5(e), the signal holding circuit 98 continues to provide the correction signal ΔS. As can shown, an output terminal of the signal holding circuit 98 is coupled to both an arithmetic amplifier 99 and an alarm 100. The alarm can provide an alarm signal when the level of the correction signal ΔS exceeds a predetermined allowable level to indicate that a malfunction or failure occurs in the pressure sensor.

The arithmetic amplifier 99 can perform its intended operations. More specifically, as described above, the correction signal ΔS is input to one of the two inputs of the amplifier 99 and also the detected pressure signal S4 from the low-pass filter 97 is input to the other input of the amplifier 99. The arithmetic amplifier 99 outputs the difference between the signals ΔS and S4 as an output signal which is calculated according to the flowing equation:

$$S5=S4-\Delta S \quad (2)$$

The signal level of the output signal S5 from the arithmetic amplifier 99 is equal to that of the reference signal $S4_{ref}$ at the time when the liquid level reaches the level of the distal bottom end 71a (i.e., the predetermined level M) and then rises as the liquid level moves upwardly from that level. The output signal S5 should have a waveform substantially similar to that of the pressure-detected signal S4 provided as long as the pressure sensor 73 operates properly. Referring to FIGS. 5(a)–(f), when the pressure sensor 73 operates properly, the signal level of the correction signal ΔS is equal to zero and the output signal S5 is equal to the pressure-detected signal S4 obtained when the pressure sensor 73 operates properly as apparent from the equation (2).

However, any drift in the pressure sensor 73 can lead to a deviation of the reference signal $S0_{ref}$ which may result in production of a pressure-detected signal S0' (indicated by the dash-double-dot line in FIG. 5(a)) up-shifted relative to the signal representative of the actual pressure. In this case, the amplifier 92 provides a pressure signal S1' (indicated by the dash-double-dot line in FIG. 5(a)) which is higher than the pressure-detected signal by ΔS. Accordingly, the low-pas filter 97 provides a pressure-detected signal S4' (indicated by the dash-double-dot line in FIG. 5(d)) which is the sum of the pressure-detected signal S4 obtained when the pressure sensor 73 operates properly and ΔS, as given by the following equation:

$$S4'=S4+\Delta S \quad (3)$$

As discussed above, since the signal holding circuit 98 subtracts the reference signal $S4_{ref}$ from the pressure-detected output signal $S4_{L-H}$ from the low-pass filter 97 at the time the liquid level reaches the predetermined position M to provide the correction signal ΔS as shown in FIG. 5(e).

The arithmetic amplifier 99 receives the pressure-detected signal S4' and the correction signal ΔS and subtracts the correction signal ΔS from the detected pressure signal S4' to provide a output signal S5 which is determined by the following equation:

$$S5=S4'-\Delta S=(S4+\Delta S)-\Delta S=S4 \quad (4)$$

In this way, the liquid level detector apparatus can provide an output signal S5 which consistently and correctly corresponds to the liquid level in the inner tank in spite of any drift in the pressure sensor 73 under the influence of the environmental conditions and/or due to deterioration with age by subtracting the correction signal ΔS (as determined by subtracting the reference signal $S4_{ref}$ from the pressure-detected signal $S4_{L-H}$) from the pressure-detected signal S4 generated by the low-pass filter 97 to offset the up-shifted component (or possibly down-shifted component).

Thereafter, the output signal is input to one of two input terminals of each of a plurality of comparators 110A, 101B etc. Also, setting signals J1, J2, etc from a setting circuit (not shown) are input to the other input terminals of the comparator circuits 110A, 101B etc, respectively. The setting signals J1, J2, etc correspond to a first liquid level, second liquid level, etc established in the inner tank 65 of the processing tank 40. When the actual liquid level reaches the first liquid level in the inner tank 65, the output signal S5 from the arithmetic amplifier 99 comes to have a level corresponding to the setting signal J1 at which time T2 the output signal from the comparator circuit 110A changes from "Low level" to "Hi level" (See FIG. 5(g)). By way of example only, it is preferred that the output terminal of the comparator circuit 110A is coupled to CPU and the like (not shown) which is coupled to a display and operated so that the condition where the liquid level reaches the first liquid level can be displayed on a monitor screen and the like.

The structure of the processing unit 12 will now be described with respect to its various component. In case where the transfer device 30 transfers a new batch of the wafers W to the processing dual tank 40, if there remains a preceding batch of the wafers W in the inner tank 65 of the dual tank 40, the wafers will collide with each other to suffer from damage thereto. To prevent damage to the wafers W due to the collision, the processing unit 12 is arranged to detect the presence of the wafer(s) W in the processing tank 40.

Figure 6:
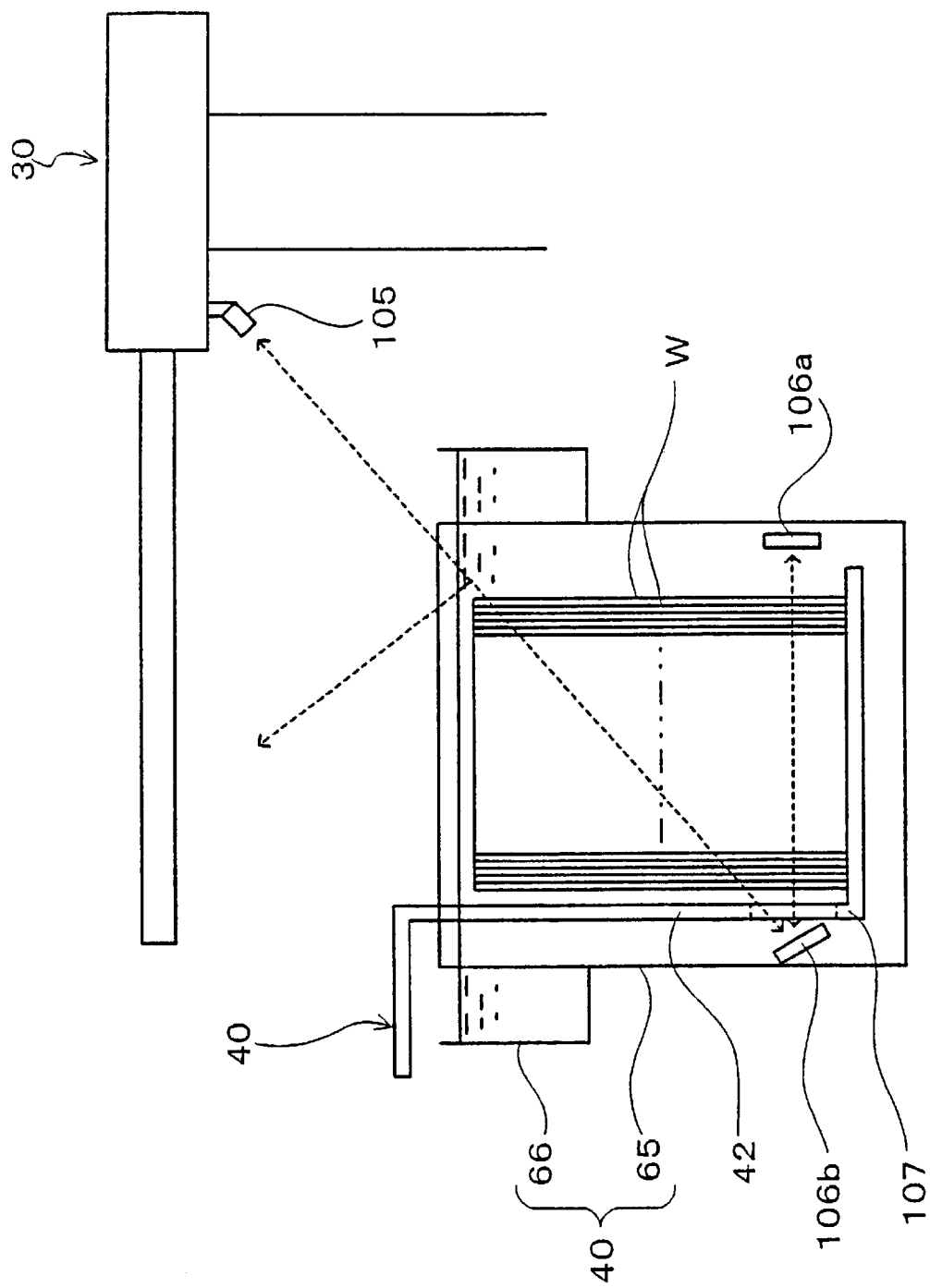
FIG. 6 is a side elevational view of a processing tank in which the wafers are contained and showing the transfer device.

As shown in FIGS. 2 and 6, the transfer device 30 for transferring wafers W to the processing tank 40 is provided with a source/detector 105 including a light source (not shown) for directing a beam of light toward the inside of the processing tank 40 and a detector (not shown) for receiving the light beam reflected from the inside of the processing tank 40. The processing tank 40 is provided with a pair of oppositely disposed reflectors 106a and 106b. Formed in the guiding member of the wafer guide 41 is a hole 107 for allowing light to pass therethrough. One reflector 106a has a reflecting surface facing to the other reflector 106b, and the reflector 106b is inclined to have a reflecting surface facing to an obliquely upward direction from the reflector 106a and the processing tank 40 (corresponding to a direction facing to the source/detector 105 when the transfer device 30 is moved). Therefore, the reflector 106b reflects not only the light beam emitted from the source/detector 105 toward the inside of the processing tank 40 but also the light reflected from the reflector 106a toward the source/detector 105.

The reflectors 106a and 106b have substantially the same structure, and their structure will be herein described with respect to the reflector 106a. FIG. 7(a) is a front view of the reflector 106a and FIG. 7(b) is a cross-sectional view thereof. Thus, the reflector 106a has a mold structure in which a metal plate 108 with a mirror face is encased in a quartz member 109 having good chemical resistance. The metal plate 108 may be made from aluminum or the like. In stead of the reflectors 106a and 106b, alternatively, the processing unit 12 can employ a reflector 110a including glass 111 with a plurality of quadrangular pyramid facets encased in the quartz 109 as is shown in FIGS. 8(a) and 8(b).

Figure 9:
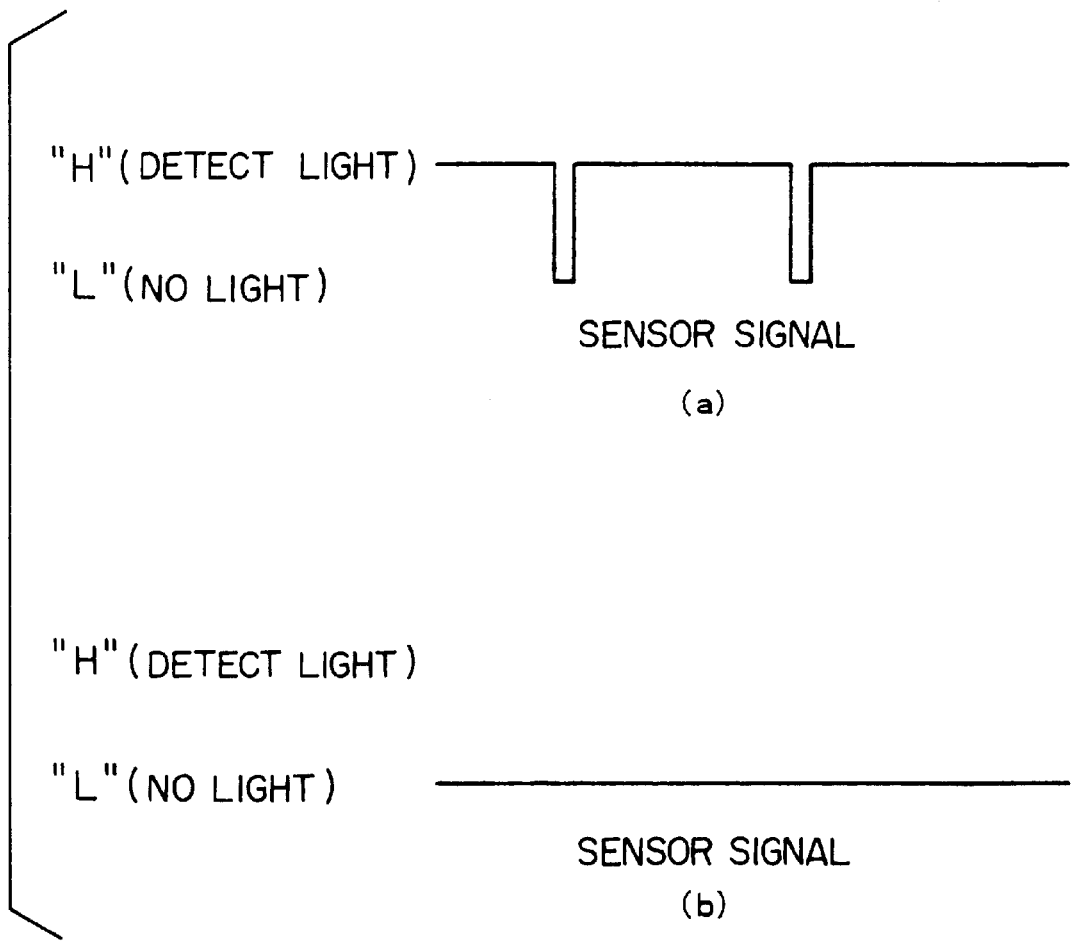
FIG. 9 is a chart showing waveforms of output signals from a light source/detector in the case of presence and non-presence of the wafers.

When the transfer device 30 arrives at the processing tank 40 and there is no wafer W in the processing tank 40, the light beam emitted from the source/detector 105 is reflected by the reflectors 106a and 106b and enters the source/detector 105. When the source/detector 105 receives the beam of light from the inside of the processing tank 40, it outputs a sensor signal at "Hi level" as is shown in FIG. 9(a) to, for example, a CPU (not shown) so as to indicate that there is no wafer W in the processing tank 40. During the detection of the presence/absence of the wafer(s) as described above, the reflected light within the processing tank 40 may be scattered due to bubbles formed in or waves raising in the liquid contained in the processing tank 40 so as not to enter the source/detector 105, and a sensor signal at "Low level" may be output. The sensor signals are, however, averaged so that the signal level can be roughly determined, thereby ignoring such a small sensor signal at "Low level". When the wafers W are in the processing tank 40, on the contrary, the light beam emitted from the source/detector 105 is reflected by the wafers W so that it never enters the source/detector 105. In this case, the source/detector 105 outputs a "Low level" sensor signal as shown in FIG. 9(b) to, for example, the CPU (not shown) so as to indicate the presence of the wafers W in the processing tank 40.

In a conventional wafer processing unit, the presence of a wafer in the processing tank is detected by providing a pair of light source and detector in an upper portion of the processing tank and another pair of light source and detector in windows respectively formed on opposing side walls of the inner tank. When no wafer is contained in the processing tank, the light beam emitted from the light source provided in the window on the side wall of the processing tank is detected by the detector provided on the other side wall, so that the detector can output a "Hi level" sensor signal. When the wafers W are contained in the processing tank, on the contrary, the beam of light emitted from the light source is broken by the wafer, so that the detector can output a "Low level" sensor signal. In the conventional processing unit, however, the presence of a wafer in the processing tank cannot be detected by the pair of light source and detector provided in the upper portion of the processing tank. Also, the pair of light source and detector provided on the side walls of the processing tank are exposed to the processing liquid overflowing the processing tank, and hence may be corroded to frequently fail. In addition, when the windows are obscured, the light beam from the light source fails to enter the detector regardless of the presence of wafer, and hence, the presence of the wafers cannot be accurately detected.

In the processing unit 12, since the source/detector 105 is provided on the transfer device 30 and the pair of reflectors 106a and 106b are provided in the processing tank 40, the presence of the wafers W can be externally detected. Therefore, the source/detector 105 can consistently transmit the beam of light to the inside of the processing tank 40, resulting in more accurately detecting the presence of wafer than in the conventional processing unit. Moreover, the source/detector 105 is never exposed to the HPM overflowing the processing tank 40 and hence minimally fails. Accordingly, the source/detector 105 can be used for a long period of time and requires minimum maintenance.

Figure 10:
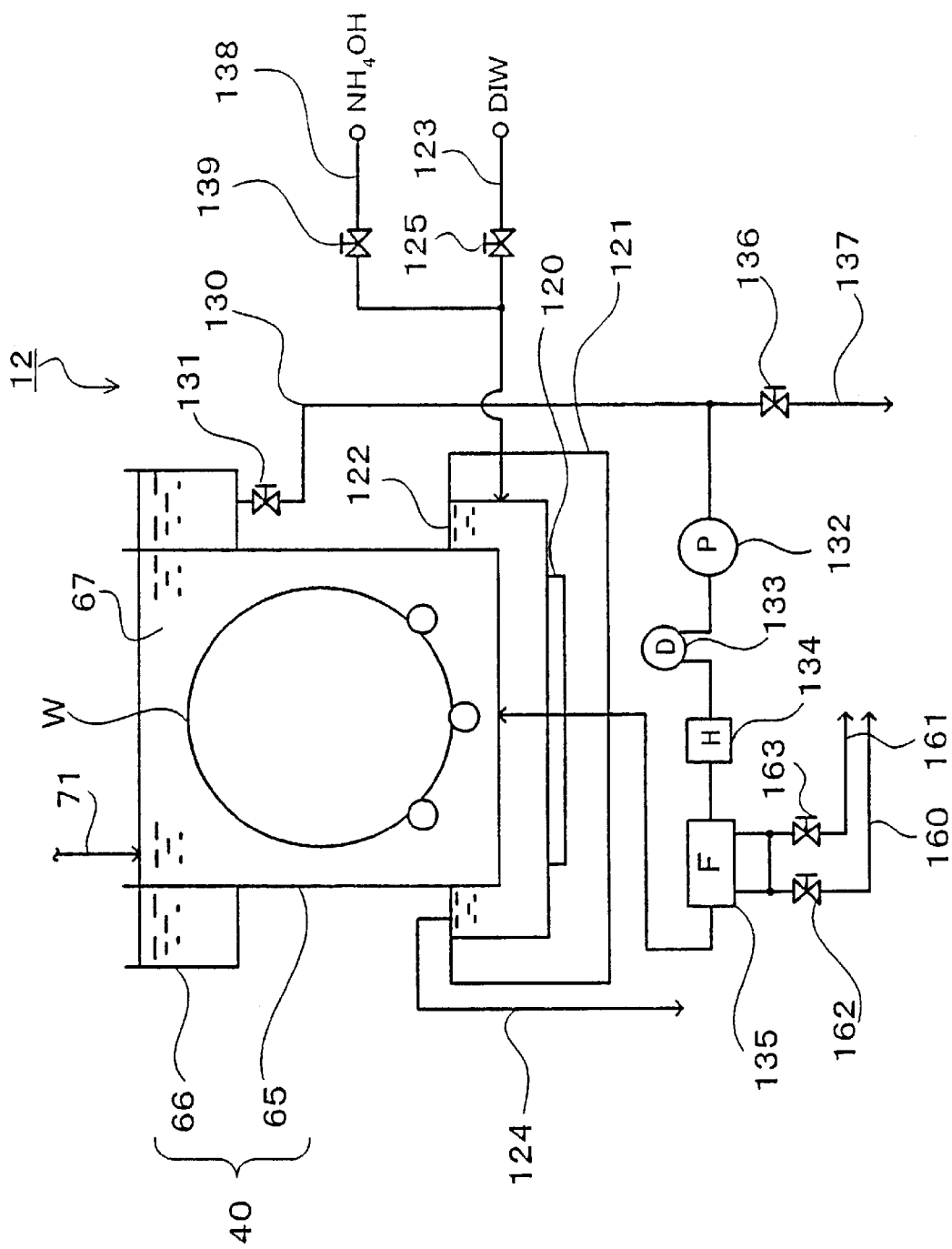
FIG. 10 is a schematic diagram of the wafer processing system.

The processing unit 12 employs megasonic cleaning. In the megasonic cleaning, the HPM contained in the processing tank 40 is vibrated by using ultrasonic energy, so as to shake down and remove particles and the like from the surfaces of the wafers W. For the megasonic cleaning, a megasonic cleaning device 121 having a diaphragm 120 for generating ultrasonic waves is installed below the processing tank 40 and a water tank (intermediate tank) 122 is provided between the megasonic device 121 and the processing tank 40 as shown in FIG. 10. The ultrasonic waves generated by the diaphragm 120 are transferred to the HPM contained in the processing tank 40 through pure water contained in the water tank 122.

The water tank 122 has connected thereto a water supply pipe 123 for supplying pure water and also an overflow pipe 124 for routing the pure water overflowing the water tank 122 to, for example, a recovery line. The water supply pipe 123 is in fluid communication with a water supply source (not shown) through a pneumatically-operated valve 125. The water supply pipe 123 supplies the fresh pure water from a lower portion of the water tank 122, so as to replace the pure water contained in the water tank 122 with the fresh pure water or to appropriately replenish pure water.

Also, in the processing unit 12 as shown, a circulation circuit 130 is connected between the inner tank 65 and the outer tank 66 for circulating the HPM during the cleaning. The inlet of the circulation circuit 130 is connected to the bottom of the outer tank 66 through a valve 131. The circulation circuit 130 has a pump 132, a dumper 133, a heater unit 134 and a filter unit 135, all of which are arranged in this order. The outlet of the circulation circuit 130 is connected to a pair of jet nozzles (not shown) disposed in a lower portion of the inner tank 65.

The HPM flowing over the inner tank 65 into the outer tank 66 is allowed to flow into the circulation circuit 130 by opening the valve 131 and successively flow through the dumper 133, the heater unit 134 and the filter unit 135 by driving the pump 132. Thus, after adjustment of its temperature and cleaning thereof, the HPM can be returned to the inner tank 65 through the jet nozzles. In this manner, the HPM is recycled for saving the consumption. A drain pipe 137 can be connected to the circulation circuit 130 via a valve 136 for draining the HPM contained in the outer tank 66. Similarly, a drain pipe (not shown) is connected to the bottom of the inner tank 65.

In the processing unit 12, a supply pipe or conduit 138 is connected to the water supply pipe 123 for supplying a solution such as an ammonia ($NH_4OH$) aqueous solution for neutralizing the HPM contained in the processing tank 40 so that the ammonia aqueous solution can be supplied to the water tank 122. The ammonia supply pipe 138 is in fluid communication with an ammonia supply source (not shown) through a pneumatically-operated valve 139. The pneumatically-operated valves 125 and 139 may be replaced with a mixing valve.

In a conventional processing unit employing the megasonic cleaning, pure water alone is contained in the water tank. Therefore, the following problem arises when the chemical contained in the processing tank is an acid solution: For example, when SC2 cleaning is carried out by using the HPM, a hydrochloric acid ambience may invade into the water tank and degrade the diaphragm through oxidation. As a result, the life of the diaphragm can be reduced.

In the processing unit 12, the ammonia aqueous solution is supplied to the water tank 122 in an appropriate amount through the ammonia supply pipe 138 and the water supply pipe 123 by opening the pneumatically-operated valve 139. The ammonia aqueous solution is supplied continuously or intermittently according to circumstances. Therefore, even when a hydrochloric acid ambience invades into the water tank 122 and the liquid contained in the water tank 122 is made acidic, the liquid can be neutralized by the ammonia aqueous solution. A chemical reaction occurring in this case is represented by the following reaction formula (5):

$$HCl + NH_2OH \rightarrow NH_4Cl + H_2O \qquad (5)$$

In this case, although ammonium chloride ($NH_4Cl$) is produced, ammonium chloride has high water solubility and is minimally adhered in the form of a solid onto the diaphragm 120 and the like, and hence, it probably does not adversely affect the process. Thus, the oxidation of the diaphragm 120 can be avoided.

Figure 11:
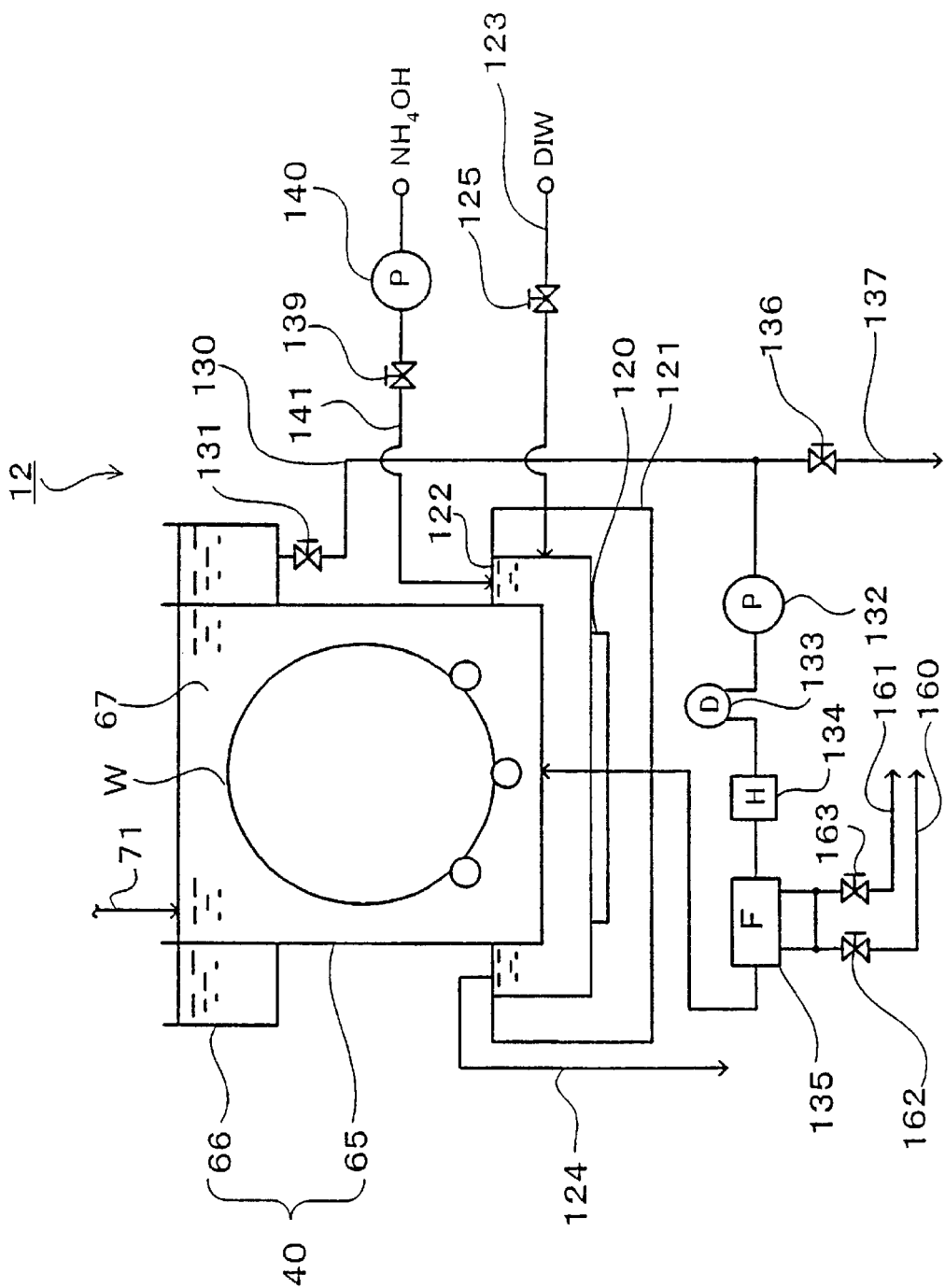
FIG. 11 is a schematic diagram of an alternative embodiment of the wafer processing system.

In the case where a large number of bubbles are formed in the water tank 122 due to the ultrasonic vibration of the diaphragm 120, the ammonia aqueous solution may be supplied from above the water tank 122 by providing an ammonia supply pipe 141 including a pump 140 as is shown in FIG. 11. In this case, the supply amount of the ammonia aqueous solution can be suitably adjusted by controlling the discharge of the pump 140. In FIGS. 10 and 11, like reference numerals are used to refer to like elements for omitting the description.

The processing unit 12 includes component for preventing overheat of the in-line heater unit 134. Specifically, as shown in FIG. 12, the in-line heater unit 134 includes a heater coil (heating element) 150 and a thermal fuse 151 that blows when the heating coil 150 generates heat exceeding a predetermined temperature. The heater coil 150 is electrically connected to an electric power source 152 via a first supply circuit 153 which is provided with a normally open MC (magnetic contactor) 154 for breaking the path to the first supply circuit 153 when the thermal fuse 151 blows.

The thermal fuse 151 is supplied with a current from a controller 156 through a second supply circuit 155. The MC 154 includes an operation coil 157 incorporated in the second supply circuit 155 and a circuit breaker 158 provided in the first supply circuit 153, so that a current from the second supply circuit 155 can be allowed to flow to the circuit breaker 158 through the operation coil 157. The circuit breaker 158 is closed in an on state for activating the first supply circuit 153. Also, the first supply circuit 153 is provided with an SSD (solid state relay) 159, which is connected to the controller 156.

In a conventional wafer processing unit, the temperature of the processing liquid contained in the processing tank is detected by a temperature sensor including, for example, a thermocouple. When the heater unit becomes overheated, the temperature of the processing liquid contained in the processing tank is increased, which may lead to an increase in the signal level of a temperature-detected signal output from the temperature sensor. Since the temperature-detected signal of the temperature sensor is a small electric signal, it can be input to a signal amplifier which amplifies it to a signal level sufficiently high for signal processing. An output signal from the signal amplifier is input to a power control circuit for controlling the power to be supplied to the heater unit. When the output signal received by the power control circuit is at a predetermined level, the power control circuit turns off the power supply to stop the heat generation of the heater unit. In the conventional processing unit, however, the signal amplifier and the power control circuit have complicated structures, and hence, when any problem arises in merely one of constituent elements of the signal amplifier and the power control circuit, a failure or malfunction can occur. For example, when the amplification factor of the signal amplifier varies due to the malfunction and an output signal from the amplifier that has a signal level higher or lower than the actual level is input to the power control circuit, the power supply may be stopped even though the heater unit is not overheated, or the power supply may be continued even though the heater unit is overheated.

In the processing unit 12, the controller 156 allows a current to flow to the second supply circuit 155. The circuit breaker 158 is closed and the MC 154 activates the first supply circuit 153. Subsequently, the power supply 152 supplies the heater line 150 through the first supply circuit 153. The heater line 150 generates heat for heating the HPM contained in the circulation circuit 130. When the heater line 150 is overheated and the temperature of the heater unit 134 exceeds a predetermined temperature, the thermal fuse 151 immediately blows. Therefore, no current flows to the second supply circuit 155, the circuit breaker 158 is opened, and the MC 154 breaks the path to the first supply circuit 153. Thus, the power supply is turn off so as to stop the heat generation of the heater line 150.

Since the first supply circuit 153 is simply opened by using the simple temperature fuse 151 and circuit breaker 154, malfunction can minimally occur. When the temperature of the heater unit 154 exceeds a predetermined temperature, the thermal fuse 151 immediately blows, so that the overheating of the heater unit 134 can be rapidly and definitely prevented. Accordingly, the processing unit can attain very high reliability in safety.

The processing unit 12 includes component for sampling the HPM contained in the processing tank 40. The filter unit 135 has connected thereto a drain pipe 160 for draining the HPM and also a sampling pipe 161 for sampling the HPM as is shown in FIG. 10. The drain pipe 160 includes a valve 162 and the sampling pipe 161 includes a valve 163. The filter unit 135 is disposed in a flow passage positioned below the processing tank 40 in the circulation circuit 130.

In a conventional processing unit, a sampling pipe is connected to an upper portion of the outer tank of the processing tank. In order to check the state of the processing liquid contained in the processing tank, it is necessary to take out the liquid by drawing it from the tank through the sampling pipe, which is considerably troublesome.

In the processing unit 12, in order to check the state of the HPM contained in the processing tank 40, the HPM is extracted from the outer tank 65 through the sampling pipe 161 provided on the filter unit 135 by opening the valve 163 with the valve 162 closed. Since the filter unit 135 is disposed in the flow path positioned below the processing tank 40 in the circulation circuit 130, the HPM can be easily taken out through the sampling pipe 161 by gravity. Accordingly, there is no need to positively draw the HPM from the tank 40 as in the conventional processing unit, resulting in reducing the difficulties in sampling. When the valve 162 is opened with the valve 163 closed, the HPM can be drained from the circulation circuit 130 through the filter unit 135.

Figure 13:
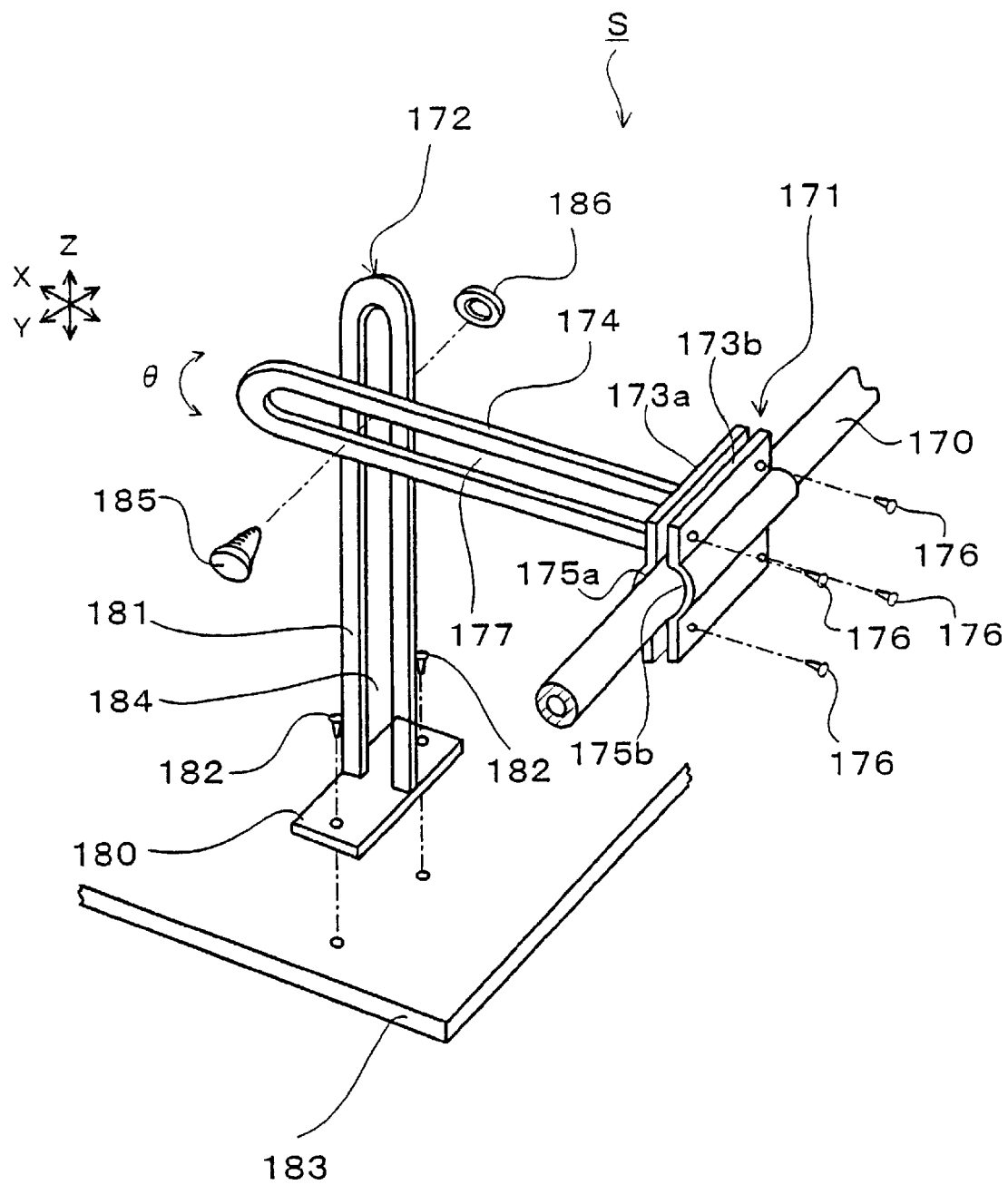
FIG. 13 is a schematic diagram of a support for piping.

A supporting member (supporting means) for use in pipe arrangement will now be described. As shown in FIG. 13, supporting members 171 and 172 are provided in a space S where a pipe 170 is to be disposed. The pipe 170 can be made of, for example, PFA (a copolymer of polytetrafluoethylene and perfluoroalkyl vinyl ether), PTFE (polytetrafluoethylene) or PVC (polyvinyl chloride)).

The supporting member 171 includes a pair of pipe holders 173a and 173b for holding the pipe 170 and a frame 174 fixedly secured to the pipe holder 173a at a right angle. The pipe holder 173a has a recess 175a and the other pipe holder 173b has a recess 175b. The pipe holders 173a and 173b, which clamp the pipe 170 within the recesses 175a and 175b with a heat insulator (not shown) of silicon rubber or the like interposed, are joined to each other with four screws 176. The frame 174 has a longitudinal hole or slot 177 formed therethrough.

The supporting member 172 includes a horizontal plate 180 and a frame 181 fixedly secured to the horizontal plate 180 at a right angle. The supporting member 172 is secured to a base 183 by mounting the horizontal plate 180 on the base 183 with two screws 182. The frame 181 also has a longitudinal hole or slot 184 formed therethrough.

In this case, the supporting member 171 is movable in the horizontal direction (X-direction) and the vertical direction (Z-direction) as well as rotatable (in the θ direction) relative to the supporting member 172. When a nut 186 on a bolt 185 extending through the slots 177 and 184 of the frames 174 and 181, respectively, is tightened as shown in FIG. 13, the supporting members 171 and 172 can be rigidly joined to each other. The position for supporting the pipe 170 in the space S can be is adjusted as follows: The bolt 185 and the nut 186 are loosened so as to separate the supporting members 171 and 172 from each other. Then, a distance between the supporting members 172 and 171 is adjusted by moving the supporting member 171 in the Z-direction or in the horizontal direction (X-direction) or rotating it in the θ direction. Thereafter, the bolt 185 is passed through the slots 177 and 184. Then, the nut 186 is fitted on the bolt and tightened to thereby join the supporting members 171 and 172 again.

For example, in the piping operations, the pipes are first supported within the corresponding space by supporting members and joined to one another. In order to successfully join the pipes to one another, it is necessary to support the pipes in place for the design demands. In general, however, a fabricator has a tendency to resort to his visual judgment on positioning of the pipes, which is very difficult. In addition, when an error is caused in placing the pipes and the pipes are fixed in shifted positions, they cannot be successfully linked to one another.

The aforementioned supporting members can overcome such problems associated with the conventional pipe arrangement. Even when the pipe 170 is supported in a roughly determined position, the supporting members 171 and 172 can be separated from each other any time as necessary, and connected again after adjusting the height (in the Z-direction), the distance (in the X-direction) and the angle (in the θ direction) of the supporting member 171 relative to the supporting member 172. In this manner, the position for supporting the pipe 170 can be easily adjusted in accordance with the relationship with another pipe or the like during the piping operation. Accordingly, the easy and efficient fabrication of the piping is allowed because the labor involved in the operation can be significantly reduced and the pipes are suitably linked. In case where the supporting member 172 is not fixed but movable in the horizontal directions (X- and Y-directions) on the base 183, greater flexibility I supporting the pipe 170 is provided.

Operation of the wafer processing system 1 as constructed above will be briefly described below.

Transfer robotic device (not shown) loads a plurality of the cassette C each containing a predetermined number of, for example 25 unprocessed wafers onto the loading platform 5 of the wafer loading station 2. At the station 2, a predetermined number, for example 50, of the wafers are removed from the two cassettes C and collectively held by the wafer chuck 36 of the transfer device 30. Thereafter, the wafers are transferred to the processing units 12 to 19 sequentially on a batch basis by means of the transfer devices 31, 32 and 33 to thereby remove numerous contaminant particles adhering on the wafer surfaces by use of a wet-type cleaning.

Next, operation of the liquid level detecting apparatus 70 for use with the wafer cleaning unit 12 for subjecting the wafers to the SC2 cleaning operation utilizing the HPM (a liquid mixture of $HCl/H_2O_2/H_2O$), will described below.

The HPM is continuously supplied to the inner tank 65 of the wafer cleaning tank assembly 40 and as a result the liquid level of the HPM rises gradually in the inner tank 65. During the initial supply of the HPM, the pressure sensor 73 will provide an output signal S0 representative of a pressure being detected in the sensor tube 71 as described above. More specifically, the pressure-detected output signal from the pressure sensor 73 is maintained at a constant (flat) level until the liquid level of the HPM reaches the level of the open distal bottom end 71a of the sensor tube 71 (the predetermined position M). As shown in FIG. 5(a), the pressure-detected output signal S0 being generated by the pressure sensor 73 from the time the gas is supplied till immediately after the liquid level reaches the predetermined position M from the bottom level of the inner tank 65, is defined as the reference signal $S0_{ref}$.

Subsequently, as the distal bottom end 71a of the hollow sensor tube 71 is immersed in the HPM in the inner tank 65, the pressure sensor 71 may produce the pressure-detected signal S0 including an alternating component or ripple resulting from the "bubbling" which may occurs at the distal bottom end 71a of the sensor tube 71. This pressure-detected output signal S0 is input to the amplifier 92 which amplifies it and outputs a signal S1 to the determination circuit 93. In the determination circuit 93, the high-pass filter 95 extracts only the alternating component in the signal S1 and produces an AC signal S2. The signal processor 96 rectifies the AC signal S2 and produces a "Hi level" output signal S3 (FIG. 5(c)), thereby providing the indication that the liquid level reaches the predetermined level position M. In this way, the use of the alternating component in the pressure signal S0 from the pressure sensor allows the determination whether the liquid level reaches the predetermined position M, i.e., the level of the open distal bottom end 71a of the sensor tube 71. Thus, the amount of the HPM within the inner tank 65 of the processing tank assembly 40 can be determined because the height of the predetermined position M measured from the bottom of the inner tank 65 is known.

On the other hand, the pressure-detected output signal S1 from the amplifier 92 is also input to the low-pass filter 97 which generates a pressure-detected signal S4, which in turn is input to the signal holding circuit 98. The signal holding circuit 98 subtracts a reference signal $S4_{ref}$ previously stored therein from a pressure signal $S4_{L-H}$ output from the low-pass filter 97 at the time the output signal from the signal processor 96 changes from "Low level" to "Hi level" (i.e., the liquid level of the HPM in the inner tank reaches the position M) to provide a correction signal ΔS (see FIG. 5(e)).

As the liquid level continues to rise past the position M in the inner tank 65, the level of the output pressure signal S0 rises accordingly. In the liquid level detector circuit 94, the arithmetic amplifier 99 can determines the difference in signal level between the pressure-detected output signal S4 and the correction signal ΔS being output from the signal holding circuit 98 to provide an output signal S5 (FIG. 5(f)) and the comparators 101A, 101B, etc are used to determine the distance or depth D measured from the distal bottom end 71a of the sensor tube 71 to the liquid level of the HPM in the inner tank 71 and thus provide the indication of the liquid level of the HPM. As the output signal S5 goes to a predetermined level, the actual liquid level of the HPM within the inner tank 40 can be determined accordingly.

The liquid level detecting apparatus 70 can carry out the liquid level detecting method which comprises the steps of supplying HPM liquid to the processing tank means 40; outputting a pressure-detected signal S0 from a pressure sensor 73 associated with a hollow sensor tube means disposed within the tank, the pressure signal S0 representing a detected pressure within the sensor tube; amplifying the pressure-detected signal S0 to produce a pressure-detected signal S1; inputting the pressure-detected signal S1 to the low-pass filter 97 to remove any alternating component in the signal S1 to produce a pressure-detected signal S4; detecting when the liquid level reaches a predetermined position level M within the tank; subtracting a reference signal $S4_{ref}$ from a signal $S4_{L-H}$ output from the low-pass filter 97 at the time the liquid level reaches the position level to provide a correction signal ΔS; and subtracting the correction signal ΔS from the pressure signal S4 after the liquid level reaches the predetermined position level M to produce a fifth signal S5 and determining the actual liquid level within the tank on the basis of the signal S5. The step of detecting when the liquid level reaches the predetermined position level M comprises the steps of inputting the second pressure signal S1 to the high-pass filter 95 to extract only the alternating component to produce an AC signal; and processing the AC signal to provide a "Hi level" output signal S3. As long as the pressure sensor 73 operates properly, the reference signal $S4_{ref}$ has a signal level which corresponds to the pressure signal $S4_{L-H}$ output from the low-pass filter 97 at the time the liquid level reaches the predetermined position level M within the inner tank.

Figure 14:
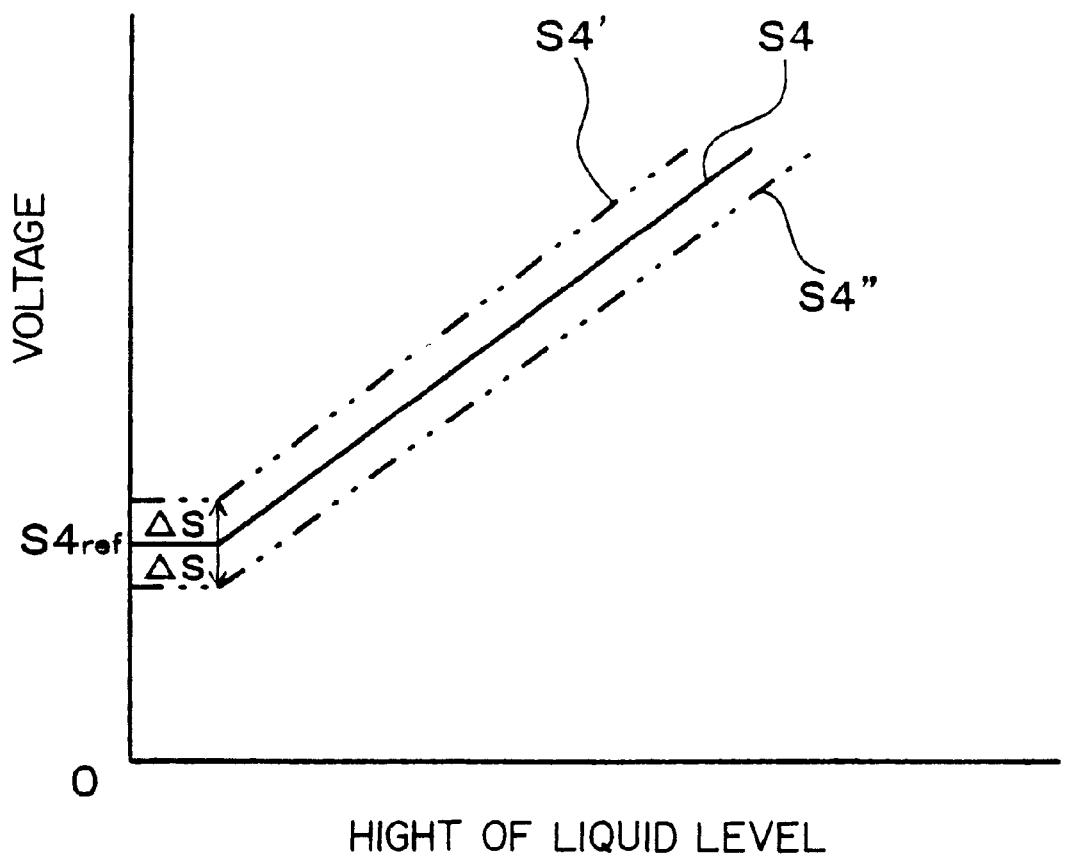
FIG. 14 is a graph showing waveforms of normal, up-shifted and down-shifted pressure signal from the detector.

When the pressure sensor 73 experiences drift due to variations in the environmental conditions (temperature, humidity, etc.) and/or deterioration with age, the pressure sensor 73 will provide the pressure signal which is up-shifted or down-shifted relative to a signal representative of the actual liquid level of the HPM within the tank 65, as shown by the dash-double-dot lines S4' and S4" in FIG. 14, thus resulting in production of the pressure signal S4' which is higher than the signal S4 by ΔS or the pressure signal S4" which is lower than the signal S4 by ΔS.

In the embodiment of the liquid level detector apparatus as described above, the liquid level detecting circuit 94 is operable to correct the pressure-detected signal S4' or S4" into proper relation with the actual liquid level on the basis of the reference signal S4 obtained before the liquid level reaches the predetermined position level M to provide a signal correctly representing the actual liquid level, which signal is substantially similar to the signal obtained when no drift occurs in the pressure sensor 74 during detection of the liquid level within the tank 65. More specifically, the corrected signal as seen in FIG. 14 can be obtained by subtracting from or adding to the signal S4 the signal ΔS corresponding to the difference between the reference signal $S4_{ref}$ obtained at the time the liquid level reaches the predetermined position level M and correction signal and the pressure signal S4' (the signal S4") produced by the drifted pressure sensor 74 when the liquid level reaches the predetermined position M. Thus, with the arrangement of the liquid level detector system 70, the liquid level of the HPM in the inner tank 65 can be correctly determined even if the pressure sensor 74 experiences drift.

Also, during the detection of the liquid level, it can be correctly determined whether the liquid level reaches the predetermined position level within the inner tank 65 because the pressure-detected output signal S0 from the pressure sensor 73 corresponds to the distance (or depth D) from the level of the open distal bottom end 71a. With this arrangement, it is possible to charge any required amount of the HPM into the processing dual tank assembly 40 so as to avoid reduced cleaning capability due to shortage of the HPM as well as waste of the HPM, which can contribute to establishment of precise, efficient and less costly manufacturing techniques, energy conservation and the like. No limit sensor or the like on the top of the processing dual tank assembly 40 for establishing the upper limit of the liquid level within the inner tank 65 thereof, is required.

Alternatively, in view of the fact that the pressure-detected signal S4 output from the low-pass filter 97 is maintained substantially at a constant level until the liquid level of the HPM being supplied reaches the predetermined position level M, the signal holding circuit 98 can provide the correction signal ΔS by subtracting the reference signal $S4_{ref}$ stored therein from the output pressure signal S4 from the low-pass filter 97 whenever before the liquid level reaches the predetermined position M rather than at the time the liquid level reaches the predetermined position M. Alternatively, the gas supply means may be electrically and directly coupled to the signal holding circuit 98 so that as the HPM is supplied to the dual tank assembly 40 the gas supply means can output the "Hi level" signal to the signal holding circuit 98. In this way, the correction signal ΔS can be obtained before the liquid level reaches the predetermined position level M by subtracting the reference signal $S4_{ref}$ from the pressure signal $S4_{L-H}$ output from the low-pass filter 97 at the time the output signal from the signal processor 96 is changed from "Low level" to "Hi level" (i.e., at the time the HPM is supplied).

Figure 15:
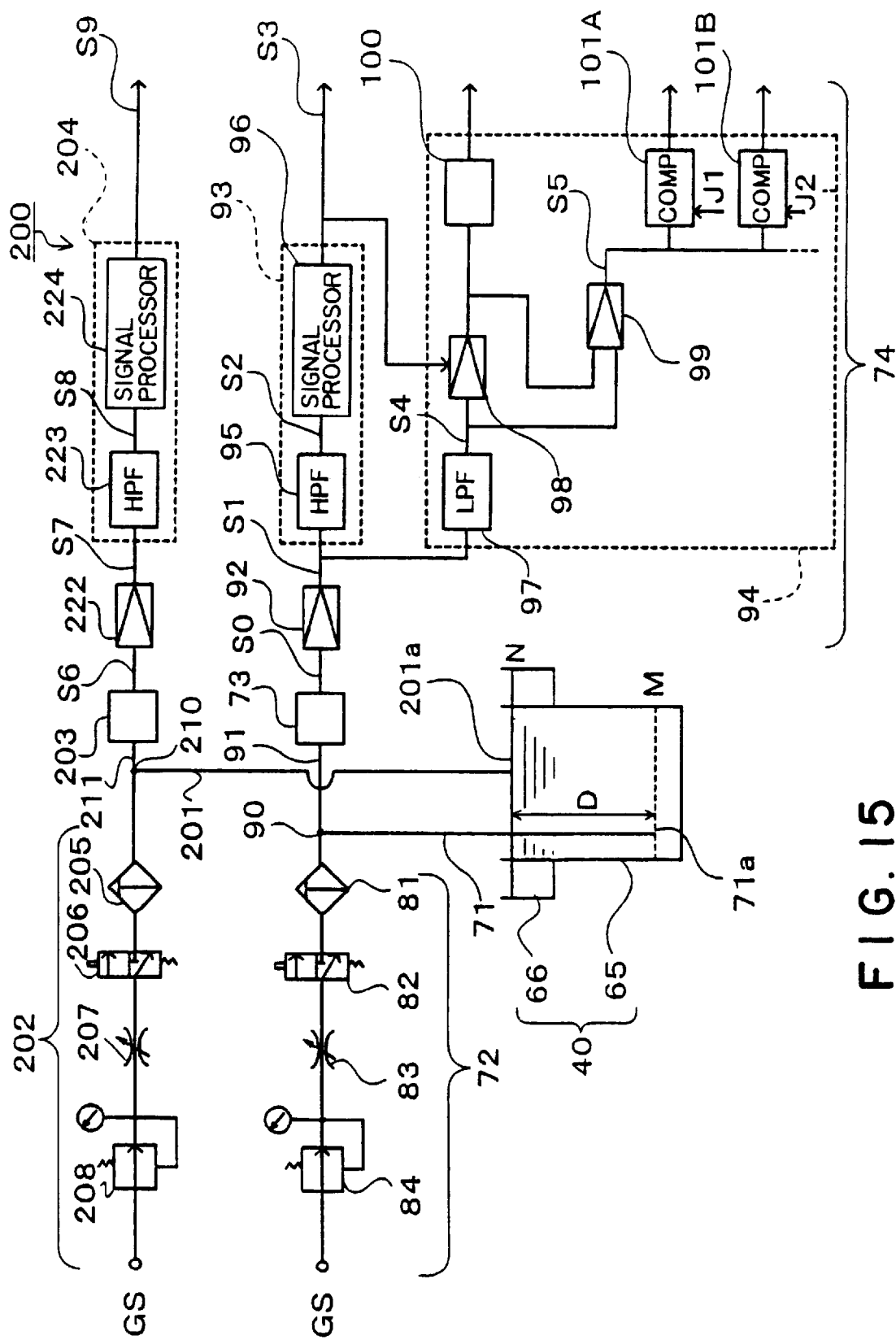
FIG. 15 is a schematic perspective view of a second embodiment of the liquid level detecting apparatus according to the present invention.

A second embodiment of the liquid level detecting apparatus 200 will be described with reference to FIG. 15. The liquid level detector apparatus 200 includes an arrangement for detecting the upper limit of the liquid level in the inner tank 65 of the processing dual tank assembly 40 in addition to the arrangement as discussed with reference to FIGS. 3 to 5. The liquid level detector apparatus 200 basically comprises an open-ended hollow sensor tube 201 used to detect the upper limit of the liquid level, gas supply means 202, pressure sensor means 203 and a determination circuit 204.

As shown, the sensor tube 201 has an open distal bottom end 201a which is positioned at a position N for defining an upper limit of the liquid level within the inner tank 65 near its top. The gas supply means 203 comprises a filter 205 disposed in the sensor tube 201, a three-way valve 206, a needle valve 207 and a regulator 208. The sensor tube 201 is fluid communication with a gas supply source such as a compressor (not shown) via the component of the gas supply means 203.

The pressure sensor 203 is fluidly connected to the hollow sensor tube via a line 211 to a connector 210 provided in the supply line between the filter 205 and the distal bottom end 201a thereof so that it can detect pressure in the sensor tube 201. Output terminal of the pressure sensor 203 is coupled to an amplifier 222 which in turn is coupled to a determining circuit 204 of the electrical circuitry 74. The determination circuit 204 is composed of a high-pass filter 223 and a signal processor 224.

As shown in FIG. 16(a), the amplifier 222 will generate a pressure-detected signal S6 which is maintained at a constant level until a time T2 at which the liquid level of the HPM being supplied to the dual tank assembly 40 reaches a level of the distal bottom end 201a of the sensor tube 201 that is defined as a predetermined upper limit position N. As the liquid level reaches the distal bottom end 201a, bubbles begin to evolve within the hollow sensor tube 201. Due to such bubbling occurring within the sensor tube 201, the signal level of the output signal S6 from the pressure sensor 203 increases while containing an alternating component or ripple as shown in FIG. 16. The pressure signal S6 is amplified by means of the amplifier 222 and the resulting pressure signal S7 is input to a high-pass filter 223. As shown in FIG. 16(b), the high-pass filter 223 provides an AC signal S8 from the time T3 that is input to a signal processor 224 which in turn outputs a "Hi level" pressure signal S9 to a CPU (not shown), for example. The CPU determines from the signal S9 that the liquid level of the HPM reaches the upper limit position N in the inner tank 65 and provide a command to terminate further supply of the HPM from the source.

As can be understood, provision of the upper limit of the liquid level within the inner tank 65 prevents the cleaning fluid from flowing thereover and serves to indicate that the inner tank 65 is filled with the predetermined amount of the cleaning fluid.

Figure 17:
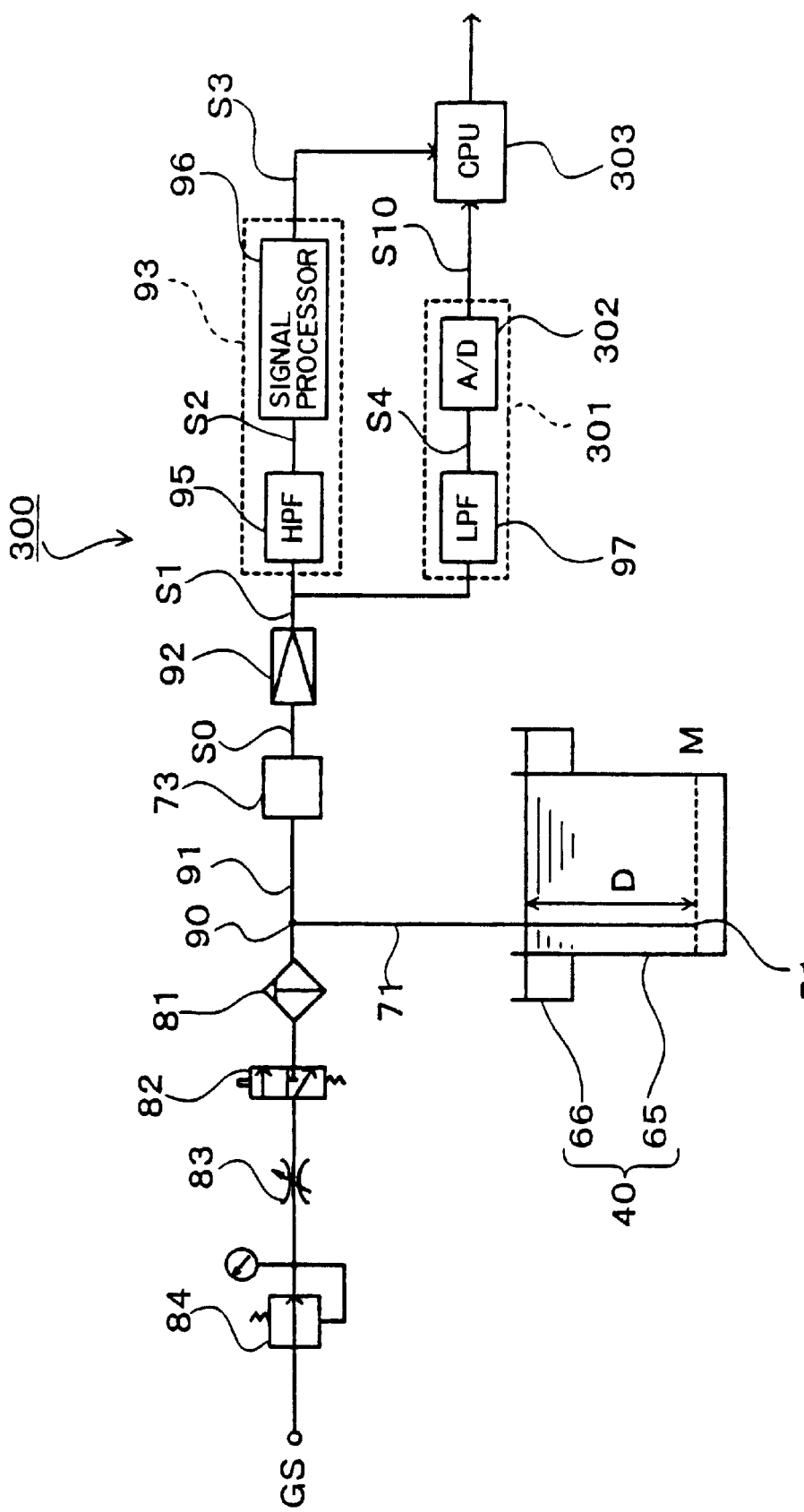
FIG. 17 is a schematic perspective view of a third embodiment of the liquid level detecting apparatus according to the present invention.

A third embodiment of the liquid level detector apparatus 300 will be described with reference to FIG. 16. Unlike the first and second embodiments of the analog type shown in FIGS. 3 and 15, the liquid level detector apparatus 300 is arranged to digitally detect the liquid level in the inner tank 65. As shown in FIG. 17, the liquid level detector apparatus 300 comprises a liquid level detecting circuit 301 in which the output of the low-pass filter 97 is coupled to an analog-to-digital converter 302 whose output is in turn coupled to a CPU 303. The output of the signal processor 96 is also input to the CPU 303.

With this arrangement of the liquid level detector apparatus 300, the analog-to-digital converter samples the output pressure signal from the low-pass filter 97 and outputs a digital signal S10 to the CPU 303. The CPU 303 previously stores a reference digital signal $S10_{ref}$ (i.e., a signal level of the digital signal S10 at the time the output signal from the signal processor 96 changes from "Low level" to "Hi level" provided that the pressure sensor 73 properly operates) and subtracts the reference digital signal $S10_{ref}$ from a digital signal $S10_{L\text{-}H}$ generated by the analog-to-digital converter at the time the output signal from the signal processor 96 changes from "Low level" to "Hi level" to produce a digital correction signal. Thereafter, the CPU 303 subtracts the digital correction signal from the output digital signal S10 from the analog-to-digital converter to thereby determine whether the liquid level reaches the predetermined level in the inner tank 65 of the dual tank assembly 40. If yes, such a condition can be visually displayed on a display monitor. The conversion of the continuously changing analog output pressure signal S4 into the digital signal S10 allows a reliable detection of the liquid level in the inner tank 65.

While several embodiments of the invention have been described it is to be understood that the invention is not limited thereto but may be otherwise embodied within the spirit and scope of the following claims. For example, the liquid level detecting apparatus of the invention can be used with a wafer coater. The liquid level detecting apparatus of the invention can also be used with tanks for processing various substrates other than a semiconductor wafer including a substrate for a liquid crystal display (LCD), a compact disk (CD), a printed circuit board, a ceramic substrate or the like by means of a processing liquid.

What is claimed is:

1. An apparatus for detecting the level of a processing liquid in a processing tank, comprising:

a hollow sensor tube having an open distal bottom end positioned at a first position in the tank and adapted to be immersed in the processing liquid;

gas supply means for supplying gas, having a pressure substantially greater than a pressure prevailing over an upper surface of the processing liquid, through the sensor tube to sufficiently fill the interior thereof entirely to the open distal bottom end;

a detecting sensor for providing an output signal representative of the gas pressure within the sensor tube;

a determination circuit, that comprises a high-pass filter for extracting any alternating component in said output signal to generate an AC signal and a signal processor for rectifying the AC signal from the high-pass filter, for determining when the liquid level reaches the first position established in the tank on the basis of said output signal from said detecting sensor;

a liquid level detecting circuit for correcting a relationship between a level of said output signal from said detecting sensor and the liquid level on the basis of a signal generated by said detecting sensor from the time the processing liquid is initially supplied to the tank until immediately after the liquid level reaches the first position to thereby detect the liquid level in the tank.

2. The apparatus according to claim 1, wherein said detecting sensor is operable to detect when the liquid level reaches a second position higher than the first position within the processing tank.

3. A method for detecting the level of a processing liquid in a processing tank, comprising the steps of:

supplying the processing liquid to the processing tank;

generating an output signal by means of a hollow sensor tube having an open distal bottom end positioned at a first position in the tank and adapted to be immersed in the processing liquid, gas supply means for supplying gas, having a pressure substantially greater than a pressure prevailing over an upper surface of the processing liquid, through the sensor tube to sufficiently fill the interior thereof entirely to the open distal bottom end and a detecting sensor providing the output signal representative of the gas pressure within the sensor tube;

detecting when the liquid level reaches said first position by means of a determination circuit comprising a high-pass filter for extracting any alternating component in said output signal to generate an AC signal and a signal processor for rectifying the AC signal from the high-pass filter; and correcting a relationship between a level of said output signal from said detecting sensor and the liquid level on the basis of a signal generated by said detecting sensor at the time the processing liquid is initially supplied until immediately after the liquid level reaches the first position to thereby detect the liquid level in the tank.

* * * * *